(12) United States Patent
Kohda et al.

(10) Patent No.: US 8,975,517 B2
(45) Date of Patent: Mar. 10, 2015

(54) ELECTRONIC COMPONENT PACKAGE, ELECTRONIC COMPONENT, AND ELECTRONIC COMPONENT PACKAGE MANUFACTURING METHOD

(75) Inventors: Naoki Kohda, Kakogawa (JP); Hiroki Yoshioka, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 216 days.

(21) Appl. No.: 13/635,024

(22) PCT Filed: Mar. 16, 2012

(86) PCT No.: PCT/JP2012/056873
§ 371 (c)(1),
(2), (4) Date: Sep. 14, 2012

(87) PCT Pub. No.: WO2012/128210
PCT Pub. Date: Sep. 27, 2012

(65) Prior Publication Data
US 2014/0083735 A1    Mar. 27, 2014

(30) Foreign Application Priority Data
Mar. 18, 2011   (JP) .................. 2011-061329

(51) Int. Cl.
*H01J 5/00*     (2006.01)
*H01J 15/00*    (2006.01)
(Continued)

(52) U.S. Cl.
CPC .................. *H05K 5/066* (2013.01); *H03H 9/21* (2013.01); *H01L 23/055* (2013.01);
(Continued)

(58) Field of Classification Search
CPC ....... H05K 1/185; H05K 1/183; H05K 3/284; H05K 13/00; H05K 2201/10674; H05K 7/20445; H05K 7/20927; H05K 1/0218; H05K 1/141; H05K 1/181; H05K 2201/10371; H05K 2203/1316; H05K 3/3436; H05K 7/2039; H01L 2924/01014; H01L 2224/48471; H01L 2924/13091; H01L 2924/3512; H01L 2924/01049; H01L 21/563; H01L 24/32; H01L 2924/01004; H01L 2224/1308; H01L 2224/29386; H01L 2224/45147; H01L 2924/0103

USPC .......... 361/760–790, 700–710; 174/520–565, 174/350–397, 50, 50.5, 50.51, 50.52, 50.53, 174/50.54, 50.55; 257/778–790

See application file for complete search history.

(56) References Cited

U.S. PATENT DOCUMENTS 4,654,694 A * 3/1987 Val ................................ 257/665
6,351,194 B2 * 2/2002 Takahashi et al. ............ 333/133
(Continued)

FOREIGN PATENT DOCUMENTS

JP   2007-281233 A   10/2007
JP   2007-335481 A   12/2007
(Continued)

*Primary Examiner* — Tuan T Dinh
*Assistant Examiner* — Ahmad D Barnes
(74) *Attorney, Agent, or Firm* — Marvin A. Motsenbocker; Mots Law, PLLC

(57) ABSTRACT

An electronic component package has a first sealing member main surface with mounted electronic element, and a second sealing member. An outer circumference portion of a second sealing member is molded into a tapered shape, providing a tapered area in at least part of the outer circumference. A flat area adjacent to the tapered area is provided in at least part of a flat portion inward of the outer circumference portion of the surface of the second sealing member. A first area corresponding to the tapered area and a second area corresponding to the flat area are provided adjacent to each other on a first main surface of the first sealing member with mounted electronic component element. A width W2 of the second area is 0.66 to 1.2 times a width W4 of the flat area. First and second bonding layers are formed and bonded with each other by heating.

5 Claims, 12 Drawing Sheets

(51) Int. Cl.
*H01J 3/08* (2006.01)
*H05K 5/00* (2006.01)
*H05K 5/06* (2006.01)
*H03H 9/21* (2006.01)
*H01L 23/055* (2006.01)
*H01L 23/10* (2006.01)
*H05K 13/00* (2006.01)
*H03H 9/10* (2006.01)

(52) U.S. Cl.
CPC ............... *H01L 23/10* (2013.01); *H05K 13/00* (2013.01); *H03H 9/1021* (2013.01); *H01L 2924/0002* (2013.01)
USPC ...... 174/50.5; 174/50; 174/50.51; 174/50.54; 174/350; 174/521

(56) References Cited

U.S. PATENT DOCUMENTS

| | | | | |
|---|---|---|---|---|
| 6,525,420 | B2* | 2/2003 | Zuo et al. | 257/715 |
| 7,436,679 | B2* | 10/2008 | Iijima et al. | 361/760 |
| 2007/0029654 | A1* | 2/2007 | Sunohara et al. | 257/678 |
| 2007/0232107 | A1* | 10/2007 | Sugiura et al. | 439/226 |
| 2008/0157897 | A1* | 7/2008 | Tilmans et al. | 333/105 |

FOREIGN PATENT DOCUMENTS

| | | | |
|---|---|---|---|
| JP | 2009-055283 | A | 3/2009 |
| JP | 2009-218512 | A | 9/2009 |
| JP | 2011-233703 | A | 11/2011 |

* cited by examiner

ELECTRONIC COMPONENT PACKAGE, ELECTRONIC COMPONENT, AND ELECTRONIC COMPONENT PACKAGE MANUFACTURING METHOD

TECHNICAL FIELD

The present invention relates to an electronic component package for hermetically sealing an electrode of an electronic component element, an electronic component having an electronic component element whose electrode is hermetically sealed by this electronic component package, and a method for manufacturing the electronic component package.

BACKGROUND ART

Inner space of a package for an electronic component (hereinafter referred to as electronic component package) such as a piezoelectric resonator device is hermetically sealed so as to prevent electrode characteristics of an electronic component element mounted in the inner space from deteriorating.

The electronic component packages of this kind include one constituted of two sealing members, namely a base and a lid, having a housing formed into a rectangular parallelepiped package. In the inner space of such a package, an electronic component element such as a piezoelectric resonator plate is bonded to and held by the base. The electrodes of the electronic component element in the inner space of the package are hermetically sealed by the base with the lid being bonded with each other.

For example, in a piezoelectric resonator device (corresponding to an electronic component in the present invention) disclosed in Patent Literature 1, a piezoelectric resonator plate is hermetically sealed in inner space of a package constituted of a base and a lid bonded with each other by brazing filler metal. In such a piezoelectric resonator device, a laminated body obtained by laminating, for example, an Mo layer, an Ni layer, and an Au layer in order is provided in an outer circumference portion of one main surface of the base before being bonded with the lid. Meanwhile, in an outer circumference portion of one main surface of the lid, brazing filler metal containing AuSn alloy is provided before the lid is bonded with the base. By performing heat treatment in a state where the laminated body provided on the base and the brazing filler metal provided on the lid are superimposed on each other, the laminated body and the brazing filler metal melt to form a bonding material, and thus the base and the lid are bonded with each other.

Incidentally, gas is produced when brazing filler metal is heated and melted. If the gas produced here enters the inner space of the package of the piezoelectric resonator device, the entering gas affects vibration characteristics of the piezoelectric resonator plate. Specifically, A CI value (equivalent series resistance) deteriorates, or fluctuation of a frequency in aging characteristics occurs.

In the piezoelectric resonator device disclosed in Patent Literature 1 mentioned above, the outer circumference portion of the lid provided with the brazing filler metal is formed in parallel with the outer circumference portion of the base provided with the laminated body, resulting in a configuration in which the heated molten material of the brazing filler metal is likely to flow in a surface direction of the main surface of the lid toward the inside of the piezoelectric resonator package. As a result, a problem arises in that a large amount of the gas produced due to the heated and melted brazing filler metal enters the inner space of the package of the piezoelectric resonator device and causes the vibration characteristics of the piezoelectric resonator plate to deteriorate.

PRIOR ART DOCUMENT

Patent Document

[Patent Document 1] JP2009-55283A

SUMMARY OF INVENTION

Problems to be Solved by the Invention

In order to reduce the amount of gas that enters the inner space of the package when the base and the lid are bonded with each other using the bonding material containing the brazing filler metal, a technique of molding the outer circumference portion of at least one of the base and the lid into a tapered shape was invented by the present applicants. According to the technique invented by the present applicants, at least one of the base and the lid is molded into a tapered shape, and thus the gap between the outer circumferences of the base and the lid is expanded toward the outside. Therefore, a meniscus of the bonding material containing the brazing filler metal is formed, and it enables the gas produced due to the heated and melted brazing filler metal to be easily emitted toward the outside of the package. In other words, it is possible to release, outside the package, the gas produced when the brazing filler metal is heated and melted, and make it hard for the gas to enter the inner space of the package.

However, even if the outer circumference portion of at least one of the base and the lid is molded into a tapered shape, in some cases the meniscus of the bonding material is not sufficiently formed between the outer circumference portions of the base and the lid, and the inner space of the package is not hermetically sealed sufficiently.

The present invention was made in consideration of the foregoing situation, and it is an object thereof to provide an electronic component package in which the gas amount in the inner space is reduced and the inside of the package is hermetically sealed reliably, an electronic component having an electronic component element whose electrode is hermetically sealed by this electronic component package, and a method for manufacturing the electronic component package.

Means for Solving the Problems

The electronic component package according to the present invention is an electronic component package for hermetically sealing an electrode of an electronic component element using a first sealing member having a first main surface on which the electronic component element is mounted, and a second sealing member, wherein a first main surface of the second sealing member is bonded with the first main surface of the first sealing member through a bonding material, an outer circumference portion of the first main surface of the second sealing member is molded into a tapered shape that tilts toward a second main surface of the second sealing member, a tapered area is provided in at least a part of the outer circumference portion molded into a tapered shape, a flat portion is provided inward of the outer circumference portion of the first main surface of the second sealing member, a flat area adjacent to the tapered area is provided in at least a part of the flat portion, a first area corresponding to the tapered area and a second area corresponding to the flat area are provided so as to be adjacent to each other on the first main surface of the first sealing member, a surface of the second area is parallel to a surface of the flat area, a width of the second area is 0.66 to 1.2 times a width of the flat area, and the bonding material is formed by heating and melting a first bonding layer formed in an entire first bonding layer formation area including the first area and the second area and a second bonding layer containing a brazing filler metal formed in an entire second bonding layer formation area including the tapered area and the flat area.

With this configuration, because the outer circumference portion of the first main surface of the second sealing member is molded into a tapered shape, the gap between the outer circumference portions of the first sealing member and the second sealing member is expanded toward the outside of the electronic component package by the outer circumference portion of the first sealing member molded into a tapered shape. As a result of the outer circumference portion of the first main surface of the second sealing member being thus molded into a tapered shape, the gap between the outer circumference portions of the first sealing member and the second sealing member is expanded toward the outside, and it becomes easy for the gas produced due to the heated and melted brazing filler metal to be emitted outside the electronic component package. Furthermore, a meniscus of the bonding material containing the brazing filler metal is formed between the outer circumference portions of the first sealing member and the second sealing member. The meniscus formation area is expanded and a meniscus having a large surface area can be formed when the outer circumference portion of the first main surface of the second sealing member is molded into a tapered shape, and therefore, it is possible to release the gas from the surface of the meniscus outside the electronic component package. In addition, the surface provided as the second area of the first sealing member is arranged parallel to the surface provided as the flat area of the second sealing member, and the width of the second area is set to be 0.66 to 1.2 times the width of the flat area. Therefore, during the formation of the bonding material by heating and melting the first bonding layer and the second bonding layer, when the molten material of the brazing filler metal contained in the second bonding layer is drawn toward the material that constitutes the first bonding layer, flow of the molten material of the brazing filler metal toward the inner space of the package is suppressed, and entry of the gas produced due to the heated and melted brazing filler metal into the inner space of the package is suppressed. Accordingly, an electronic component package in which the gas amount within the inner space is reduced can be obtained. Furthermore, in the case where the width of the second area is set to be 0.66 to 1 times the width of the flat area, when the first sealing member and the second sealing member are arranged opposite to each other, the end portion of the first bonding layer on the package inner space side does not protrude toward the inner space of the package further than the end portion of the second bonding layer containing the brazing filler metal on the package inner space side.

Further, the width of the second area in the first sealing member is set to be 0.66 to 1.2 times the width of the flat area of the second sealing member, so that the contact area between the first bonding layer and the second bonding layer is sufficiently maintained. Therefore, during the manufacturing process, position shift hardly occurs when the first bonding layer and the second bonding layer are superimposed on each other and heat treatment is performed. As a result, an electronic component package in which the inner space of the package is hermetically sealed reliably can be obtained.

Further, in the electronic component package according to the present invention, an inner space in which the electronic component is hermetically sealed may be formed as a result of the first sealing member and the second sealing member being bonded with each other by the bonding material, and the flat area and the second area may be provided further outward of the electronic component package than the inner space.

With the abovementioned configuration, it is possible to reduce the chance of the gas that may be produced at the time of melting of the bonding material for bonding entering the inner space, and as a result, it is possible to suppress adverse influence on the electronic component element mounted within the package, and improve the reliability of the electronic component package. For example, in the case of the electronic component element being a piezoelectric resonator plate, it is possible to stabilize electrical characteristics such as CI and improve the reliability of the electronic component package.

Further, in the electronic component package according to the present invention, a surface of the first bonding layer may be made of Au plating, and the brazing filler metal may be made of AuSn alloy.

With this configuration, because the molten material of the brazing filler metal is reliably drawn toward Au that constitutes the surface of the first bonding layer, it is possible to reliably suppress flow of the molten material of the brazing filler metal toward the inner space side of the package, and reliably suppress entry of the gas produced due to the heated and melted brazing filler metal into the inner space of the package.

Further, the electronic component according to the present invention is an electronic component in which an electrode of an electronic component element is hermetically sealed by the electronic component package according to the above-described present invention.

With this configuration, in the electronic component, the electrode of the electronic component element is hermetically sealed reliably.

The electronic component package manufacturing method according to the present invention is a method for manufacturing an electronic component package for hermetically sealing an electrode of an electronic component element, and the method includes: a first molding step of molding a first sealing member having a first main surface on which the electronic component element is mounted; a second molding step of molding a second sealing member; a first bonding layer forming step of forming a first bonding layer on the first main surface of the first sealing member; a second bonding layer forming step of forming a second bonding layer containing a brazing filler metal on a first main surface of the second sealing member; and a bonding step of heating and melting the first bonding layer and the second bonding layer in a state where the first bonding layer and the second bonding layer are superimposed on each other, forming a bonding material, and bonding the first main surface of the second sealing member with the first main surface of the first sealing member, wherein in the second molding step, an outer circumference portion of the first main surface of the second sealing member is molded into a tapered shape that tilts toward a side of a second main surface of the second sealing member, and a flat portion is provided inward of the outer circumference portion of the first main surface of the second sealing member, in the second bonding layer forming step, a tapered area is provided in at least a part of the outer circumference portion of the second sealing member molded into a tapered shape, a flat area adjacent to the tapered area is provided in at least a part of the flat portion provided inward of the outer circumference portion of the first main surface of the second sealing member, and the second bonding layer is formed in an entire second bonding layer formation area including the tapered area and the flat area, in the first bonding layer forming step, a first area corresponding to the tapered area and a second area corresponding to the flat area are provided so as to be adjacent to each other on the first main surface of the first sealing member, a width of the second area is 0.66 to 1.2 times a width of the flat area, and the first bonding layer is formed in an entire first bonding layer formation area including the first area and the second area, in the bonding step, a surface of the second area is arranged parallel to a surface of the flat area, and the first bonding layer and the second bonding layer are heated and melted in a state where the first bonding layer and the second bonding layer are superimposed on each other.

With this method, in the second molding step, the outer circumference portion of the first main surface of the second sealing member is molded into a tapered shape, and therefore, the gap formed during the bonding step between the first sealing member and the second sealing member when the first sealing member and the second sealing member are superimposed on each other can be expanded toward the outside. By thus molding the outer circumference portion of the first main surface of the second sealing member into a tapered shape, the gap between the outer circumference portions of the first sealing member and the second sealing member are expanded toward the outside, and it becomes easy for the gas produced due to the heated and melted brazing filler metal to be emitted outside the package. Further, by melting the bonding layers in the bonding step, a meniscus of the bonding material containing the brazing filler metal is formed between the outer circumference portions of the first sealing member and the second sealing member. In the second molding step, the meniscus formation area between the outer circumference portions of the first sealing member and the second sealing member can be expanded by forming the outer circumference portion of the second sealing member into a tapered shape. Therefore, in the bonding step, it is possible to form a meniscus having a large surface area, and release the gas outside the package from the surface of the meniscus. Moreover, in the first bonding layer forming step, the first bonding layer is formed in the entire first bonding layer formation area in which the width of the second area of the first sealing member is set to be 0.66 to 1.2 times the width of the flat area. Therefore, when the surface provided as the second area is arranged parallel to the surface provided as the flat area, and the first bonding layer of the first sealing member and the second bonding layer of the second sealing member are superimposed on each other, the end portion of the first bonding layer on the package inner space side does not protrude toward the inner space side of the package further than the end portion of the second bonding layer containing the brazing filler metal on the package inner space side. Therefore, during the formation of the bonding material by heating and melting the first bonding layer and the second bonding layer, when the molten material of the brazing filler metal contained in the second bonding layer is drawn toward the material that constitutes the first bonding layer, flow of the molten material of the brazing filler metal toward the inner space of the package is suppressed, and entry of the gas produced due to the heated and melted brazing filler metal into the inner space of the package is suppressed. As described above, with the abovementioned method, when the first sealing member and the second sealing member are bonded with each other in the bonding step, it is possible to make it hard for the gas produced due to the heated and melted brazing filler metal to flow toward the inner space side of the package, and as a result, an electronic component package in which the gas amount within the inner space is suppressed can be manufactured.

Furthermore, in the first bonding layer forming step, the first bonding layer is formed in the entire first bonding layer formation area in which the width of the second area of the first sealing member is set to be 0.66 to 1.2 times the width of the flat area of the second sealing member arranged parallel to the second area, so that the contact area between the first bonding layer and the second bonding layer is sufficiently maintain. Therefore, in the bonding step, position shift hardly occurs when the first bonding layer and the second bonding layer are superimposed on each other and heat treatment is performed. As a result, the inner space of the electronic component package can be hermetically sealed reliably.

Effects of the Invention

According to the present invention, it is possible to provide an electronic component package in which the gas amount within inner space is suppressed and the inside of the package is hermetically sealed reliably, an electronic component in which an electronic component element is hermetically sealed by this electronic component package, and a method for manufacturing the electronic component package.

MODES FOR CARRYING OUT THE INVENTION

Embodiments of the present invention will be hereinafter described with reference to the drawings. Note that in the following embodiments, the case where the electronic component package of the present invention is applied to a package of a crystal resonator, which is a piezoelectric resonator device, and the electronic component element of the present invention is applied to a tuning folk-shaped crystal resonator plate, which is a piezoelectric resonator plate.

Figure 1:
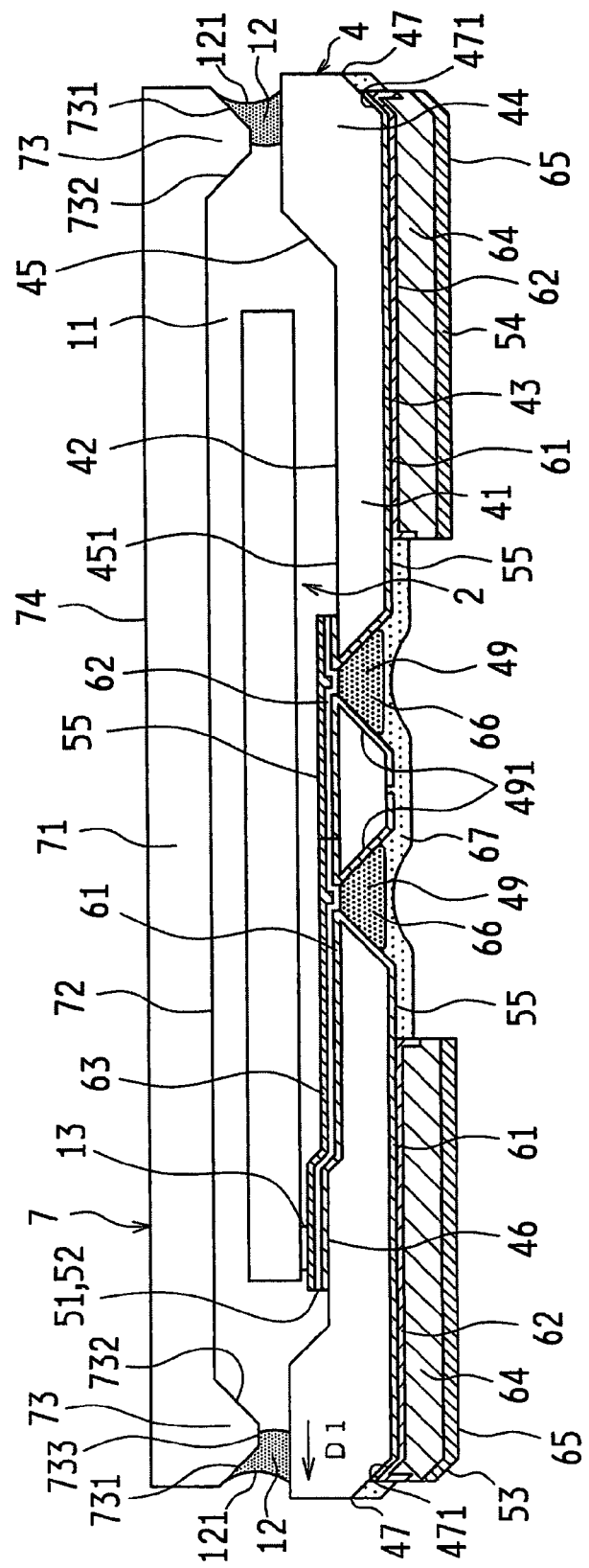
FIG. 1 is a schematic cross-sectional view showing inner space of a crystal resonator according to the present embodiment, whose is entirely cut out along line A-A on a base shown in FIG. 2.

A crystal resonator 1 (corresponding to an electronic component in the present invention) according to the present embodiment is provided, as shown in FIG. 1, with a crystal resonator plate 2 (corresponding to an electronic component element in the present invention) that is a tuning folk-shaped crystal plate, a base 4 (corresponding to a first sealing member in the present invention) for holding the crystal resonator plate 2 and hermetically sealing the crystal resonator plate 2, and a lid 7 (corresponding to a second sealing member in the present invention) arranged opposite to the base 4 for hermetically sealing driving electrodes 31 and 32 (each corresponding to an electrode of the electronic component element in the present invention) of the crystal resonator plate 2 held by the base 4.

With this crystal resonator 1, the base 4 and the lid 7 are bonded with each other by a bonding material 12 containing brazing filler metal made of an alloy of Au and Sn, and as a result of this bonding, a body housing having hermetically sealed inner space 11 is formed. In the inner space 11, the crystal resonator plate 2 is electromechanically bonded with the base 4 by ultrasonic bonding by means of the FCB (Flip Chip Bonding) technique using a conductive bump 13 such as a gold bump. Note that in the present embodiment, a plating bump of a nonfluxional material, such as a gold bump, is used as the conductive bump 13. Note that the base 4 and the crystal resonator plate 2 may alternatively be bonded by a conductive resin bonding material.

Next, the constituents of the crystal resonator 1 will be described.

Figure 2:
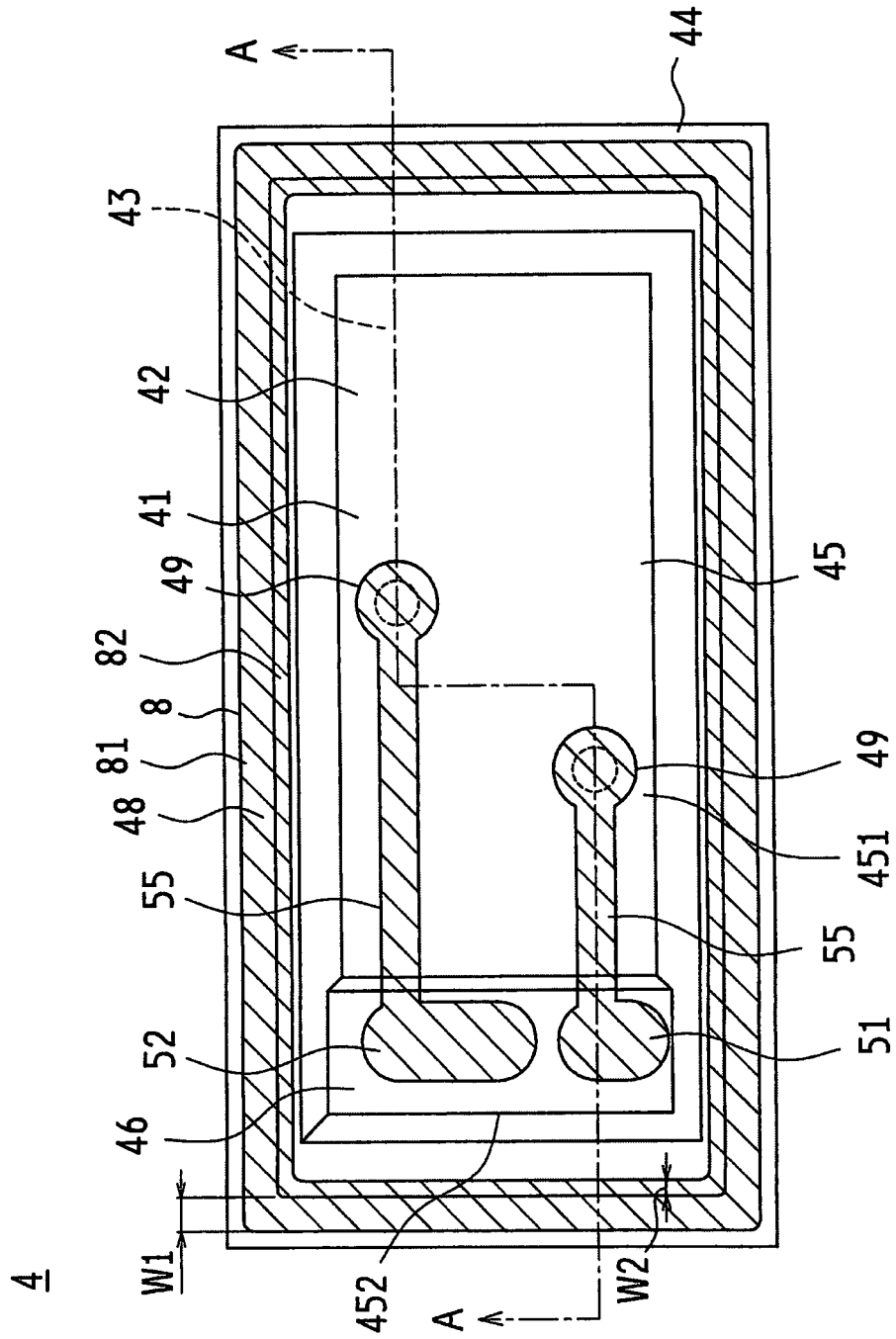
FIG. 2 is a schematic plan view of the base according to the present embodiment.
Figure 3:
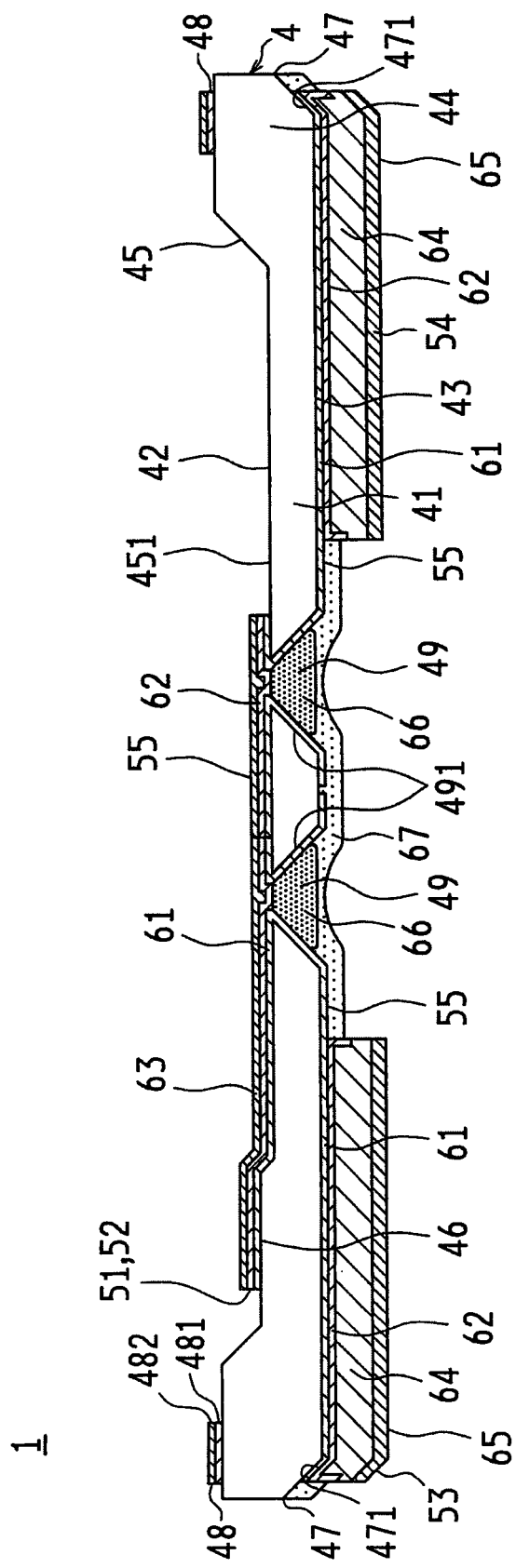
FIG. 3 is a schematic cross-sectional view of the base according to the present embodiment that is cut out along line A-A shown in FIG. 2.
Figure 4:
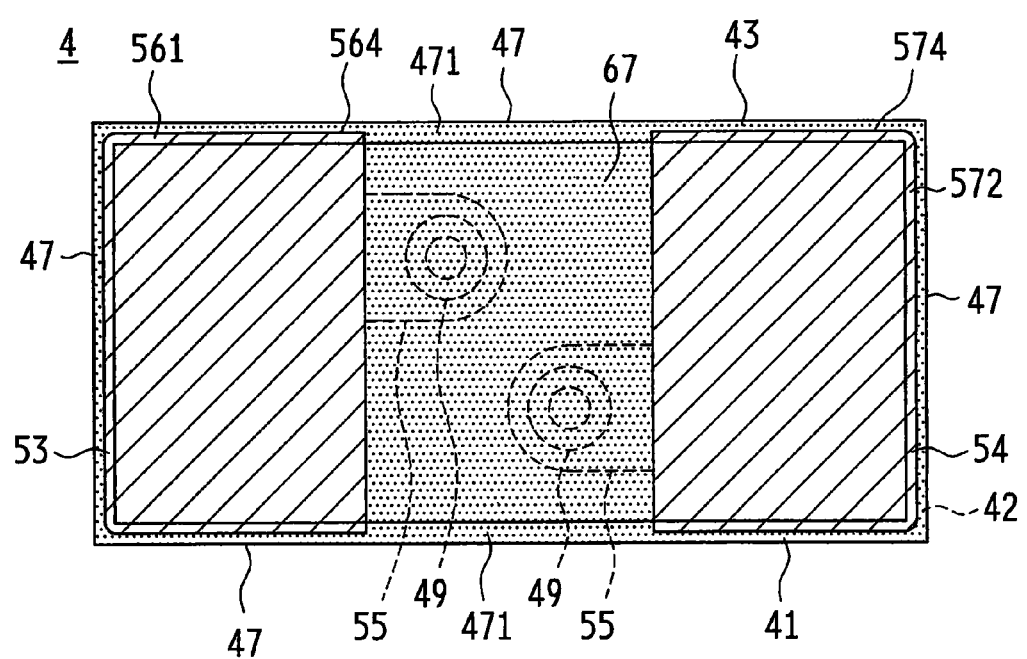
FIG. 4 is a schematic back view of the base according to the present embodiment.

The base 4 is made of a glass material such as borosilicate glass, and is molded, as shown in FIGS. 2 to 4, into a box-shaped body having a bottom portion 41 and a wall portion 44 that extends upwards from the bottom portion 41 along the outer circumference of a first main surface 42 of the base 4. This base 4 is molded into a box-shaped body by performing wet etching on a rectangular parallelepiped single-plate base material.

The inner surface of the wall portion 44 of the base 4 is molded into a tapered shape. Also, the outer circumference portion of an upper surface of the wall portion 44 is a bonding portion to be bonded with the lid 7. As shown in FIG. 2, the base material of the portion of the base 4 that serves as the bonding portion is provided with a first bonding layer formation area 8, and a first bonding layer 48 to be bonded with the lid 7 is formed to have a uniform thickness in the entire first bonding layer formation area 8.

Figure 8:
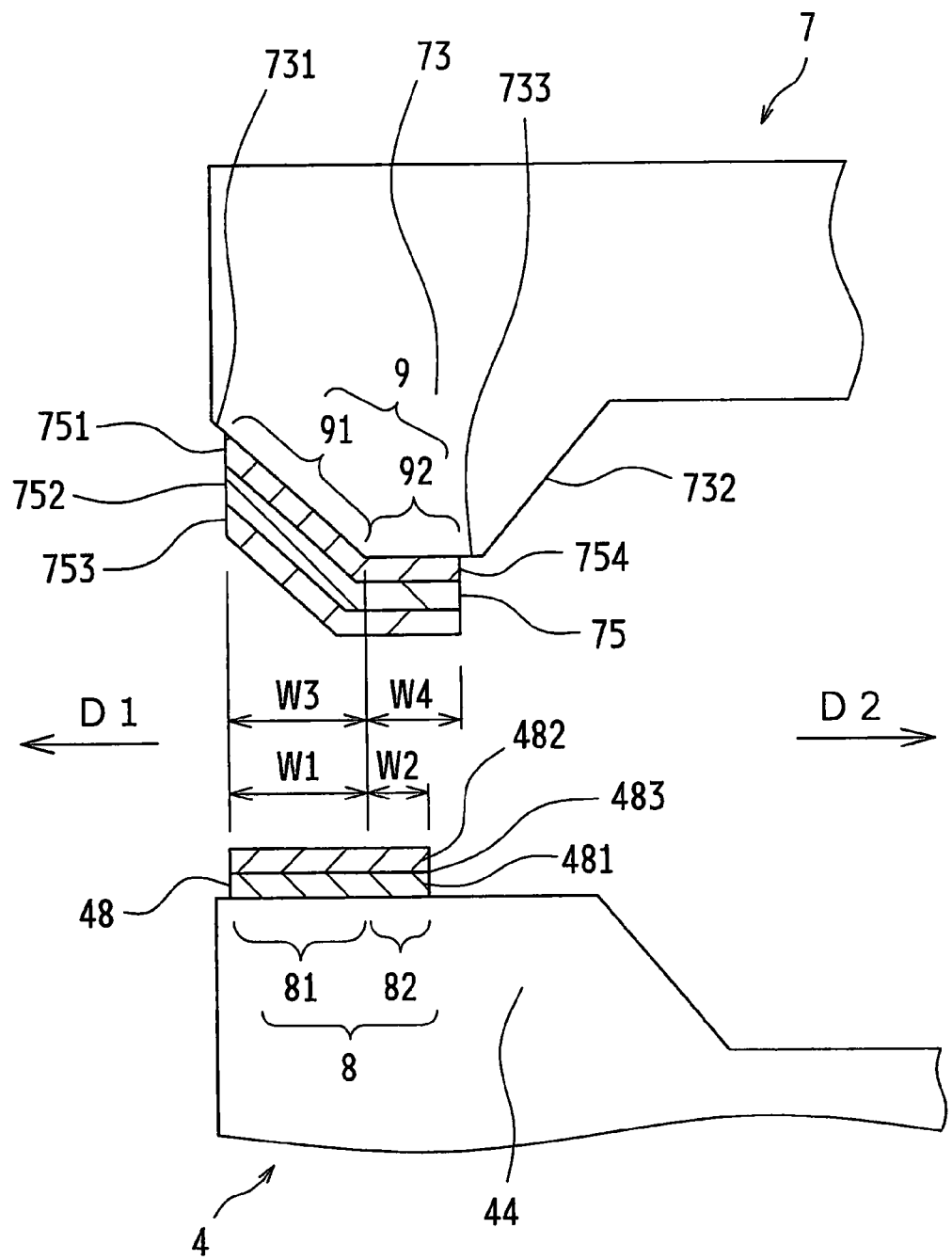
FIG. 8 is an enlarged partial cross-sectional view of a state of outer circumference portions of the base and the lid according to the present embodiment that are arranged opposite to each other.
Figure 9:
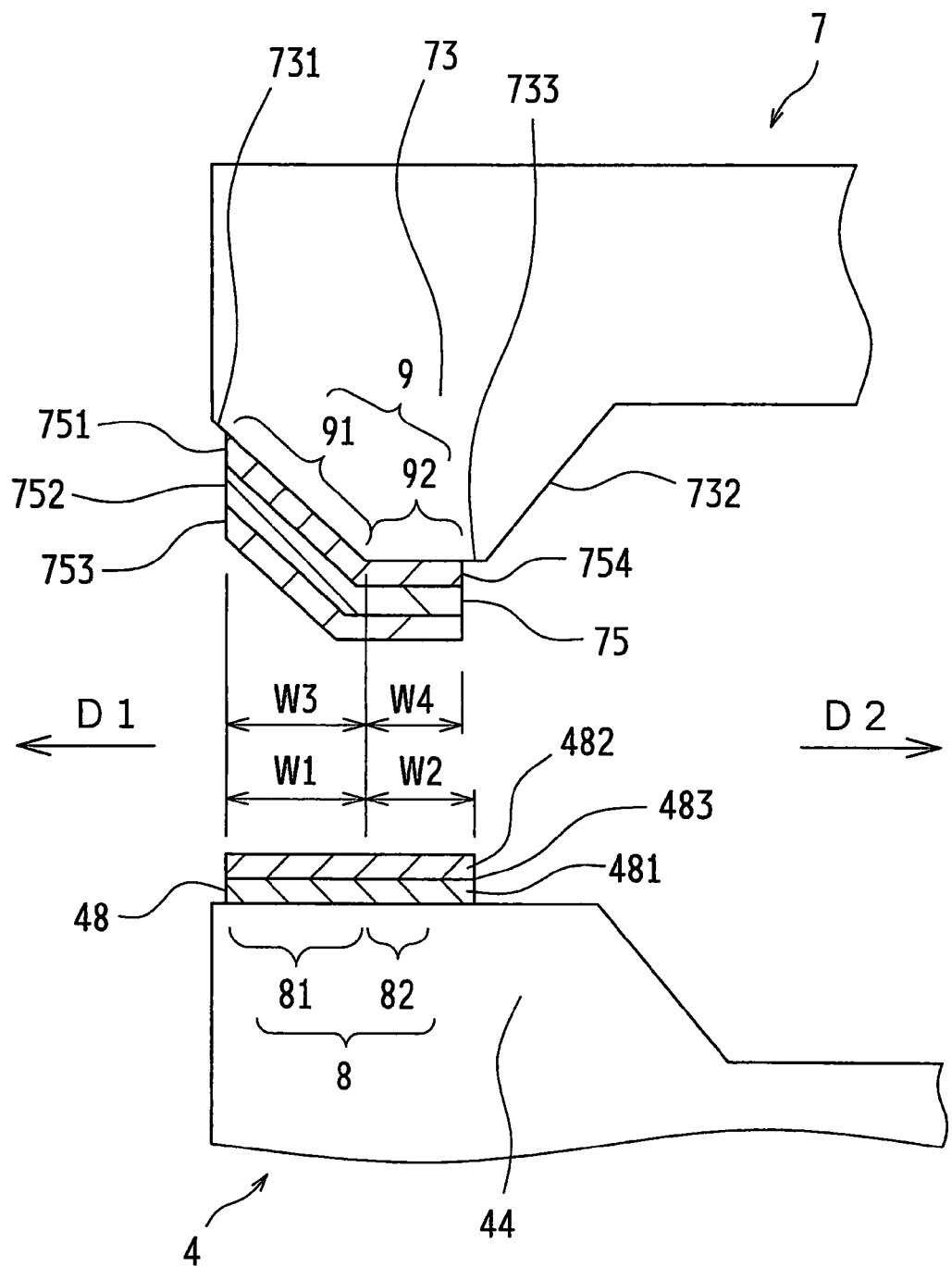
FIG. 9 is an enlarged partial cross-sectional view of a state of the outer circumference portions of the base and the lid according to the present embodiment that are arranged opposite to each other.

The first bonding layer formation area 8 includes, as shown in FIG. 2, a first area 81 and a second area 82 adjacent to the first area 81. As shown in FIGS. 8 and 9, when the base 4 and the lid 7 are arranged opposite to each other, the first area 81 corresponds to a tapered area 91 of the lid 7, which will be described later (i.e., faces the tapered area 91 through the first bonding layer 48 and a second bonding layer 75). The second area 82 corresponds to a flat area 92 of the lid 7, which will be described later (i.e., faces the flat area 92 through the first bonding layer 48 and the second bonding layer 75). The upper surface of the wall portion 44 is arranged parallel to an upper surface (edge surface) 733 of the wall portion 73 of the lid 7, which will be described later, and thus the surface of the second area 82 is parallel to the surface of the flat area 92 of the lid 7, which will be described later. In the present embodiment, the width W1 of the first area 81 is 53.0 μm. The width W2 of the second area 82 is 18.2 to 26.0 μm, which is 0.66 to 1.2 times the width W4 of a flat area 92 of a second bonding layer formation area 9, which will be described later, provided to the base material of the lid 7. Note that on the first main surface 42 of the base 4, the direction from the outside toward the inside is the width direction.

The first bonding layer 48 has a laminated structure formed by a plurality of layers, and includes a sputtered film 481 formed by sputtering in the entire first bonding layer formation area 8 of the base material of the base 4 using the sputtering technique, and a plating film 482 formed by plating on the sputtered film. The sputtered film 481 is configured from a Ti film (not shown) formed by sputtering in the entire first bonding layer formation area 8 of the base material of the base 4 using the sputtering technique, and Au film (not shown) formed by sputtering on the Ti film using the sputtering technique. The thickness of the Ti film that constitutes in the sputtered film 481 is 0.1 to 0.5 μm, and the thickness of the Au film is 0.03 to 0.2 μm. The plating film 482 is made of an Au film formed by plating on the sputtered film. The thickness of the Au film that constitutes the plating film 482 is 5 to 6 μm.

On the first main surface 42 of the base 4, a cavity 45 surrounded by the bottom portion 41 and the wall portion 44 that is rectangular in a planar view is molded. On a bottom surface 451 of the cavity 45, a mount portion 46 is formed by etching along an entire end portion 452 in the longitudinal direction of the bottom surface 451. The crystal resonator plate 2 is mounted on this mount portion 46. Note that a wall surface of the cavity 45 is an inner surface of the wall portion 44, and is molded into a tapered shape, as mentioned above.

Also, on a second main surface 43 (a housing back surface) of the base 4, as shown in FIGS. 2 to 4, a tapered surface 471 that tilts from the second main surface 45 toward the first main surface 42 side along the entire outer circumference 47 is formed.

Also on the base 4, a pair of electrode pads 51 and 52 that are electromechanically bonded respectively with the driving electrodes 31 and 32 of the crystal resonator plate 2, external terminal electrodes 53 and 54 to be electrically connected to external components or external devices, and a wiring pattern 55 for electrically connecting the electrode pad 51 with the external terminal electrode 53, and the electrode pad 52 with the external terminal electrode 54 are formed. Those electrode pads 51 and 52, the external terminal electrodes 53 and 54, and the wiring pattern 55 constitutes electrodes of the base 4. The electrode pads 51 and 52 are formed on the surface of the mount portion 46.

Each of the electrode pads 51 and 52 is constituted of a first sputtered film 61 formed by sputtering on a base plate of the base 4, a second sputtered film 62 formed on the first sputtered film 61, and an Au plating film 63 formed on the second sputtered film. Note that the first sputtered film 61 that constitutes each of the electrode pads 51 and 52 is made of a Ti film (not shown) formed by sputtering using the sputtering technique on the first main surface 42 of the base 4 and a Cu film (not shown) formed by sputtering using the sputtering technique on the Ti film, and the second sputtered film 62 is made of a Ti film (not shown) formed by sputtering using the sputtering technique on the first sputtered film 61, and an Au film (not shown) formed by sputtering using the sputtering technique on the Ti film. The Au plating film 63 is made of an Au film formed by plating on the second sputtered film 62.

The wiring pattern 55 extends from the first main surface 42 of the base 4 via inner surfaces 491 of through holes 49 (see the description below) to the second main surface 43 of the base 4 so as to electrically connect the electrode pads 51 and 52 with the external terminal electrodes 53 and 54. The wiring pattern 55 is constituted of the first sputtered film 61 formed on the base plate of the base 4, and the second sputtered film 62 and the Au plating film 63 are formed on the first sputtered film 61 in a portion located on the first main surface 42 of the base 4. The first sputtered film 61, the second sputtered film 62, and the Au plating film 63 of the wiring pattern 55 have the same structure as the first sputtered film 61, the second sputtered film 62, and the Au plating film 63 of each of the abovementioned electrode pads 51 and 52, respectively.

The external terminal electrodes 53 and 54 are provided on the tapered surface 471 of the second main surface 471, as shown in FIG. 4. Specifically, they are provided respectively on both end portions in the longitudinal direction of the second main surface 43, and arranged in parallel with an interval therebetween to be aligned with the longitudinal direction.

Each of the external terminal electrodes 53 and 54 is constituted of the first sputtered film 61 formed by sputtering on the base plate of the base 4, the second sputtered film 62 formed on the first sputtered film 61, an Ni plating film 64 formed on the second sputtered film 63, and an Au plating film 65 formed on the Ni plating film 64. Note that the first sputtered film 61 and the second sputtered film 62 of the external terminal electrodes 53 and 54 have the same structure as the first sputtered film 61 and the second sputtered film 62 of the abovementioned electrode pads 51 and 52 and wiring pattern 55. Of the external terminal electrodes 53 and 54, the Ni plating film 64 is made of an Ni film formed by plating on the second sputtered film 62, and the Au plating film 65 is made of an Au film formed by plating on the Ni plating film 64.

The base 4 is also provided, as shown in FIGS. 2 to 4, with the through holes 49 for leading, by the wiring pattern 55, the driving electrodes 31 and 32 of the crystal resonator plate 2 from inside the cavity 45 to outside the cavity 45 via the electrode pads 51 and 52.

The through holes 49 are formed by wet etching at the same time as the molding of the cavity 45 when the base 4 is molded by wet etching using the photolithography technique, and as shown in FIGS. 2 to 4, two through holes 49 are formed in the base 4 so as to penetrate through the two main surfaces 42 and 43, respectively. The inner surface 491 of each through hole 49 tilts relative to the first main surface 42 and the second main surface 43 of the base 4, and is molded into a tapered shape. The diameter of the through hole 49 is, as shown in FIGS. 1 and 3, largest at its end portion on the second main surface 43 side of the base 4, and is smallest at the end portion on the first main surface 42 side of the base 4. As the technique for forming the through holes 49, a technique other than the wet etching technique, such as the dry etching technique, the shot blast technique including the sand blast technique, the drilling technique using a drill, or the like may be employed, for example.

On the inner surface 491 of each through hole 49, the first sputtered film 61 made of Ti and Cu, which is a part of the wiring pattern 55, is formed. Further, inside each through hole 49, a filler constituted of Cu is filled above the first sputtered film 61 to form a filling layer 66, which fills up the through hole 49. The filling layer 66 is constituted of a Cu plating film formed by electroplating on the surface of the first sputtered film 61.

On the second main surface 43 of the base 4, a resin pattern 67 constituted of a resin material is formed. In the present embodiment, the resin pattern 67 is formed in the entire area of the second main surface 43 of the base 4 excluding the formation area of the external terminal electrodes 53 and 54. This resin pattern 67 seals, on the second main surface 43 side, an end portion of the through hole 49 in which the filling layer 66 is formed, and the sealing strength of the through hole 49 is maintained. Note that as described above, the bonding strength of the resin pattern 67 to the base material (glass material) of the base 4 is sufficiently maintained by forming the resin pattern 67 on the entire area of the second main surface 43 excluding the formation areas of the external terminal electrodes 53 and 54 so that contact area between the base material that constitutes the base 4 and the resin pattern 67 are sufficiently maintained. Further, in the case of employing, as the method for manufacturing the base 4 according to the present embodiment, a method with which a large number of bases 4 are formed on a wafer and those bases 4 formed on the wafer are separated into pieces by dicing, occurrence of chipping of the wafer (glass material) due to dicing is suppressed because the outer circumference 47 of the base 4, which serves as a wafer cutting portion, is covered with the resin pattern 67.

As the resin material that constitutes the resin pattern 67, polybenzoxazole (PBO) is used. Note that the resin material that constitutes the resin pattern 67 is not limited to PBO, but any resin materials with a good adhesion to the material (e.g., glass material) of the base 4 may be used. Accordingly, as the resin material of the resin pattern 67, benzocyclobutene (BCB), epoxy, polyimide, or the like, as well as PBO, may be used. Further, the resin material that constitutes the resin pattern 67 used in the present embodiment, that is, PBO is a resin material having photosensitivity, and a resin material with which the pattern can be formed using the photolithography technique. Here, it is assumed that the "resin material having photosensitivity" is a broad concept covering not only resin materials made of resin having photosensitivity, but also photosensitive resin compositions containing photosensitive materials and resin.

Figure 5:
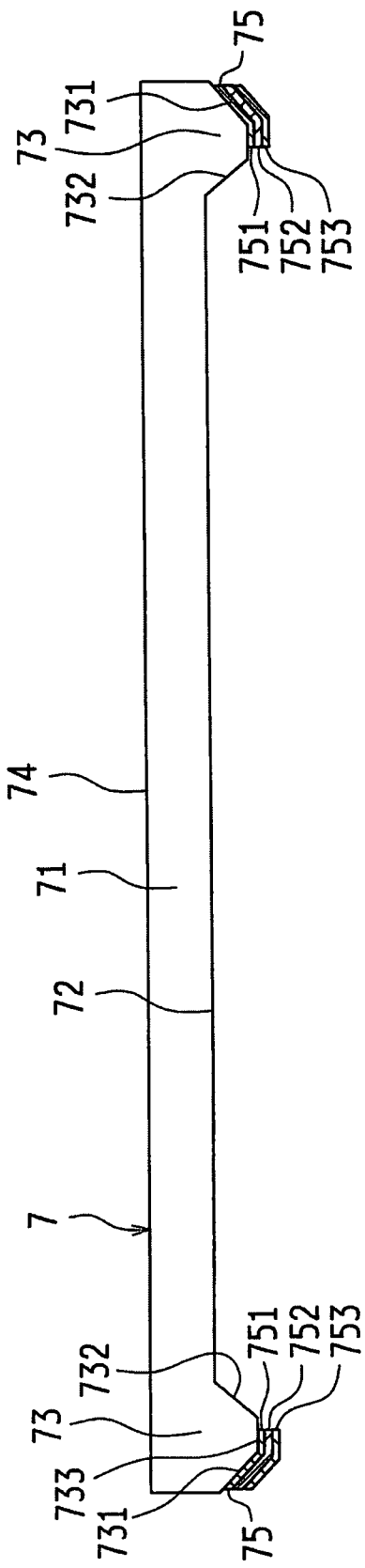
FIG. 5 is a schematic cross-sectional view of a lid according to the present embodiment.

The lid 7 is made of a glass material such as borosilicate glass, and is constituted, as shown in FIGS. 1 and 5, of a top portion 71 and a wall portion 73 that extends from the top portion 71 downwards along the outer circumference of a first main surface 72 of the lid 7. This lid 7 is molded by performing wet etching on a rectangular parallelepiped single-plate base material.

An outer side surface 731 (the outer circumference portion of the first main surface 72) of the wall portion 73 of the lid 7 is molded into a tapered shape that tilts from the first main surface 72 toward the second main surface 74 side. An inner side surface 732 of the wall portion 73 of the lid 7 is molded into a tapered shape.

Figure 6:
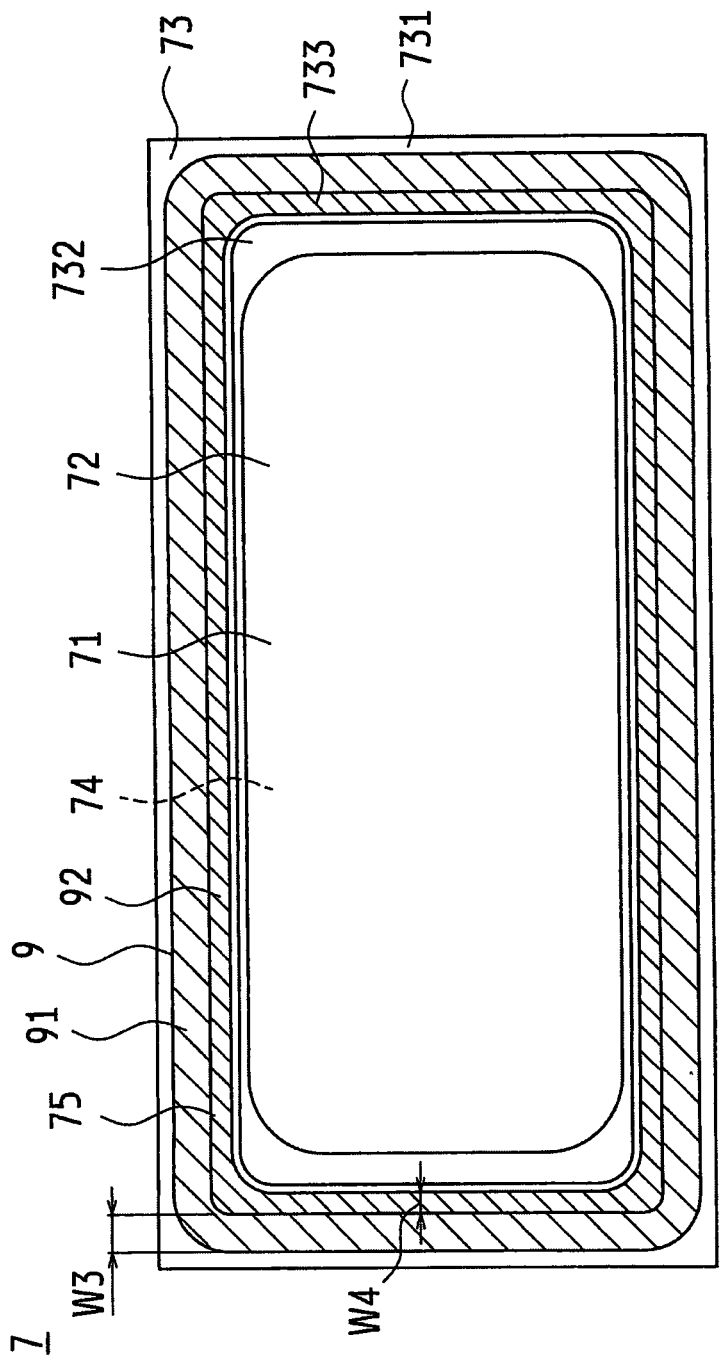
FIG. 6 is a schematic back view of the lid according to the present embodiment.

An outer side surface 731 and an upper surface (edge surface) 733 of the wall portion 73 of the lid 7 serve as portions bonded with the base 4, and the base material of those bonded portions of the lid 7 is provided with the second bonding layer formation area 9, as shown in FIG. 6. In the entire second bonding layer formation area 9, the second bonding layer 75 to be bonded with the base 4 of a uniform thickness is formed.

As shown in FIGS. 6, 8, and 9, the second bonding layer formation area 9 includes of the tapered area 91 and the flat area 92 adjacent to the tapered area 91. The tapered area 91 is provided on a part of the outer side surface 731 (the outer circumference portion of the first main surface 72) molded into a tapered shape. Specifically, the tapered area 91 is provided on the entire outer side surface 731 except the outer edge thereof. The flat area 92 is provided on a part of the upper surface 733 (a flat portion located inward of the outer circumference portion of the first main surface 72) of the wall portion 73. Specifically, the flat area 92 is provided on the entire upper surface 733 except a portion adjacent to the inner side surface 732. In other words, the second bonding layer formation area 9 and the second bonding layer 75 formed in the second bonding layer formation area 9 are formed further outward (the direction D1 shown in FIGS. 8 and 9) of the lid 7 than the edge portion to be the border between the inner side surface 732 and the upper surface 733, and the second bonding layer formation area 9 and the second bonding layer 75 formed in the second bonding layer formation area 9 is not formed on the edge portion. With this configuration, the base 4 and the lid 7 are bonded with each other by the bonding material 12 to form the inner space 11 in which the crystal resonator plate 2 is hermetically sealed, and the flat area 92 and the second area 82 are provided further outward of the package than the inner space 11. With such a configuration in which the flat area 92 is provided on a part of the upper surface 733, the second bonding layer 75 is not formed on the portion (the edge portion) of the upper surface 733 that is adjacent to the inner side surface 732. Therefore, the second bonding layer formation area 9 and the second bonding layer 75 formed in the second bonding layer formation area 9 do not exist in the inner space 11 of the package, and entry of molten material (mainly brazing filler metal) produced by heating of the second bonding layer 75 into the inner space 11 of the package through the inner side surface 732 is suppressed.

As described above, the tapered area 91 corresponds to the first area 81 of the base 4, and the flat area 92 corresponds to the second area 82 of the base 4. The upper surface 733 of the wall portion 73 is arranged parallel to the upper surface of the wall portion 44 of the base 4, and thus, the surface of the flat area 92 is arranged parallel to the surface of the second area 82 of the base 4. In the present embodiment, the width W3 of the tapered area 91 is 52.0 μm, and the width W4 of the flat area 92 is 27.5 μm. Note that in the first main surface 72 of the lid 7, the direction from the outside toward the inside is the width direction.

As shown in FIG. 5, the second bonding layer 75 has a laminated structure formed by a plurality of layers, and is configured from a sputtered film 751 formed by sputtering in the entire second bonding layer formation area 9 of the base material of the lid 7, an Au/Sn plating film 752 formed by plating on the sputtered film 751, and an Au plating film 753 formed by plating on the Au/Sn plating film 752. The sputtered film 751 is configured from a Ti film formed by sputtering in the entire second bonding layer formation area 9 of the base material of the lid 7 using the sputtering technique, and an Au film (not shown) formed by sputtering on the Ti film.

The thickness of the Ti film that constitutes the sputtered film 751 is 0.1 to 0.5 μm, and the thickness of the Au film is 0.03 to 0.2 μm. The Au/Sn plating film 752 is constituted of an Au film formed by plating on the sputtered film 751 and an Sn film formed by plating on the Au film. The thickness of the Au/Sn plating film 752 is 5.5 to 6.5 μm. Further, the Au plating film 753 is constituted of an Au strike plating film formed by plating on the Au/Sn plating film 752, and an Au plating film formed by plating on the Au strike plating film. The thickness of the Au plating film 753 is 0.6 μm. In the abovementioned second bonding layer 75, the Au/Sn plating film 752 is heated and thus melted, and forms an AuSn alloy (the brazing filler metal) film. Note that the Au/Sn plating film 752 may also be one formed by plating the sputtered film 751 with the AuSn alloy.

The crystal resonator plate 2 is a Z-plate quartz crystal into which a crystal blank (not shown) that is an anisotropic crystal plate is formed by wet etching.

Figure 7:
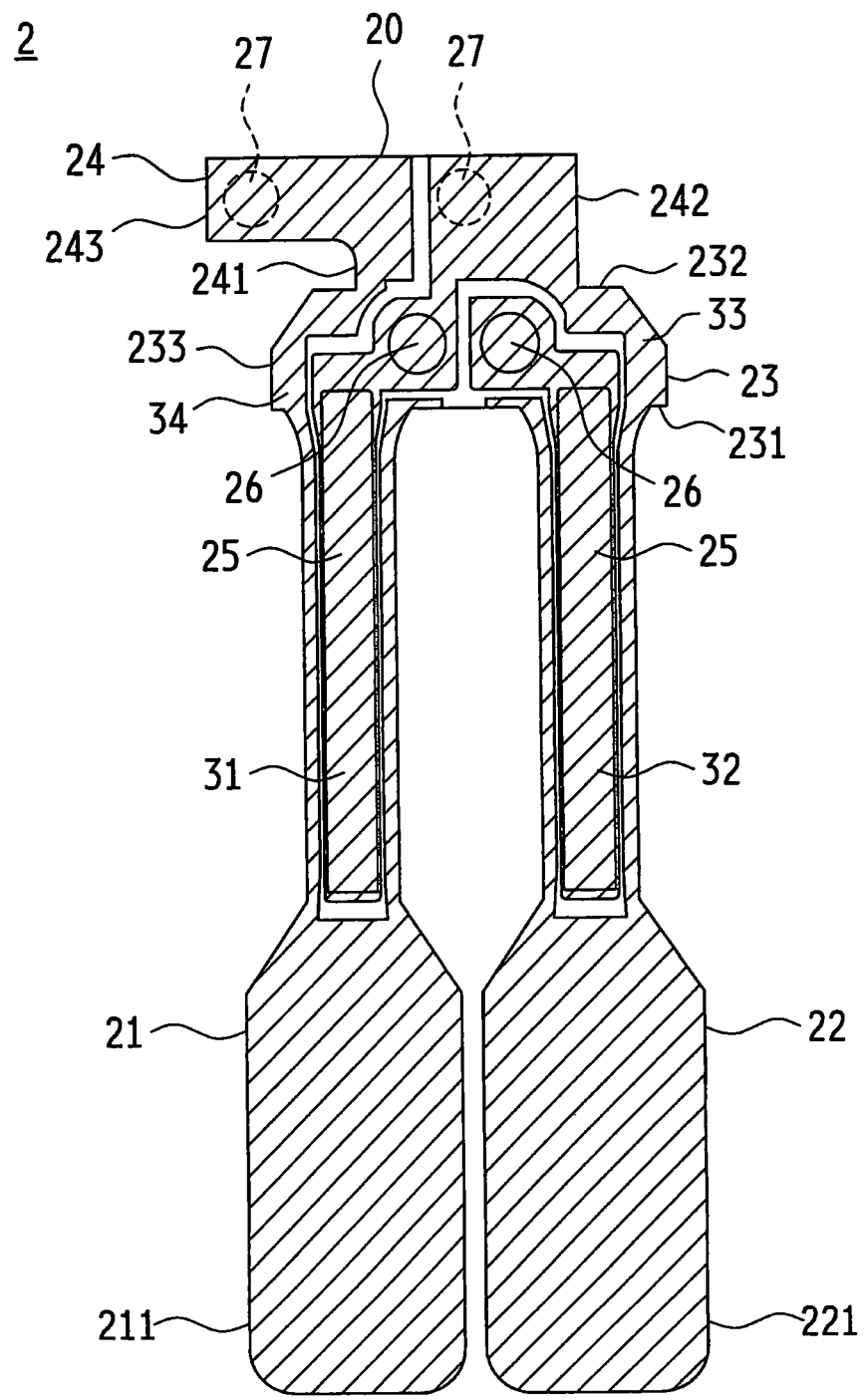
FIG. 7 is a schematic plan view of a crystal resonator plate according to the present embodiment.

As shown in FIG. 7, the crystal resonator plate 2 includes a piezoelectric resonator blank 20 constituted of two legs 21 and 22 serving as resonating portions, a base portion 23, and a bonded portion 24 to be bonded with the electrode pads 51 and 52 of the base 4, with the two leg portions 21 and 22 being provided to a first end surface 231 of the base portion 23 so as to protrude therefrom, and with the bonded portion 24 being provided to a second end surface 232 so as to protrude therefrom.

The base portion 23 has a bilaterally symmetrical shape in a planar view, as shown in FIG. 7. Of a side surface 233 of the base portion 23, a portion on the first end surface 231 side has the same width as the first end surface 231, and a portion on the second end surface 232 side has the width that is gradually narrowed toward the second end surface 232 side.

The two leg portions 21 and 22 are provided so as to protrude from the first end surface 231 of the base portion 23 in the same direction, as shown in FIG. 7. Tip portions 211 and 221 of the two legs 21 and 22 are formed to be wider than other portions of the leg portions 21 and 22 (wider in the direction perpendicular to the protruding direction), and tip corners respectively of the tip portions 211 and 221 are formed to have a curved surface. Each of the main surfaces of the two leg portions 21 and 22 has a groove portion 25 in order to improve a CI value (series resistance value).

The bonded portion 24 is provided so as to protrude from the center of the second end surface 232 of the base portion 23 in the width direction, as shown in FIG. 7. The bonded portion 24 is constituted of a short side portion 241 that protrudes in a vertical direction in a planar view with respect to the second end surface 232 of the base portion 23, and a long side portion 242 that extends to the tip portion of the short side portion 241, is bent at a right angle in a planer view at the tip portion of the short side portion 241, and protrudes in a width direction of the base portion 23. The tip portion 243 of the bonded portion 24 is oriented toward the width direction of the base portion 23. In other words, the bonded portion 24 is molded into an L shape in a planar view. The bonded portion 24 is also provided with bonded points 27 to be bonded with the electrode pads 51 and 52 of the base 4 via the conductive bump 13.

On the crystal resonator plate 2 having the above-described configuration, the first and second driving electrodes 31 and 32 having different potentials, and the extracting electrodes 33 and 34 extracted from the first and second driving electrodes 31 and 32 to electrically connect those first and second driving electrodes 31 and 32 with the electrode pads 51 and 52 of the base 4 are formed.

A part of the first and second driving electrodes 31 and 32 is formed inside the groove portions 25 in the leg portions 21 and 22. Therefore, even if the crystal resonator plate 2 is miniaturized, resonance loss of the leg portions 21 and 22 is suppressed, and the CI value can be kept at a low level.

The first driving electrode 31 is formed on two main surfaces of one leg portion 21, two side surfaces of the other leg portion 22, and two main surfaces of the tip portion 221. Similarly, the second driving electrode 32 is formed on two main surfaces of the other leg portion 22, two side surfaces of the leg portion 21, and two main surfaces of the tip portions 211.

The extracting electrodes 33 and 34 are formed on the base portion 23 and the bonded portion 24, the first driving electrode 31 formed on the two main surfaces of the leg portion 21 is connected, by the extracting electrode 33 formed on the base portion 23, to the first driving electrode 31 formed on the two side surfaces of the other leg portion 22 and the two main surfaces of the tip portion 221, the second driving electrode 32 formed on the two main surfaces of the other leg 22 is connected, by the extracting electrode 34 formed on the base portion 23, to the second driving electrode 32 formed on the two side surfaces of the leg portion 21 and the two main surfaces of the tip portion 211.

Note that in the base portion 23, two through holes 26 that penetrate through two main surfaces of the piezoelectric resonator blank 20 is formed, and the inside of these through holes 26 is filled with conductive material. The extracting electrodes 33 and 34 are routed between the two main surfaces of the base portion 23 via these through holes 26.

The crystal resonator 1 having the above-described configuration is manufactured by the method described below.

That is, initially, the base 4 is molded (the first molding step in the present invention). Also, the lid 7 is molded (the second molding step in the present invention). In the second molding step, as described above, the outer circumference portion of the first main surface 72 of the lid 7, more specifically, the outer side surface 731 of the wall portion 73 is molded into a tapered shape.

Then, the first bonding layer 48 is formed in the entire first bonding layer formation area 8 of the base material of the base 4 shown in FIG. 2 (the first bonding layer forming step in the present invention). Specifically, as shown in FIGS. 2, 8, and 9, on the first main surface 42 of the base 4, the first area 81 corresponding to the tapered area 91 of the lid 7 and the second area 82 corresponding to the flat area 92 of the lid 7 are provided so as to be adjacent to each other, and the first bonding layer 48 is formed in the entire first bonding layer formation area 8 including the first area 81 and the second area 82. At this time, the width W2 of the second area 82 is set to 0.66 to 1.2 times the width W4 of the flat area 92. Also, on the base 4, the electrode pads 51 and 52, the wiring pattern 55, the external terminal electrodes 53 and 54, and the resin pattern 67 are formed. At this time, the fling layer 66 is formed inside the through hole 49 of the base 4, thereby filling up the through hole 49.

Further, the second bonding layer 64 is formed in the entire second bonding layer formation area 9 in the base material of the lid 7 shown in FIG. 6 (the second bonding layer forming step in the present invention). Specifically, as shown in FIGS. 6, 8, and 9, the tapered area 91 is provided on the outer side surface 731 of the wall portion 73 of the lid 7 that is molded into a tapered shape. Also, the flat area 92 is provided on the upper surface 733 of the wall portion 73 of the lid 7 so as to be adjacent to the tapered area 91. Then, the second bonding layer 75 is formed in the entire second bonding layer formation area 9 including the tapered area 91 and the flat area 92.

Next, as shown in FIG. 1, the crystal resonator plate 2 is electromechanically bonded by ultrasonic bonding with the base 4 via the conductive bump 13 using the FCB technique, thereby mounting the crystal resonator plate 2 on the base 4. Thus, the driving electrodes 31 and 32 of the crystal resonator plate 2 are electromechanically bonded with the electrode pads 51 and 52 of the base 4 via the extracting electrodes 33 and 34, the terminal electrodes, and the conductive bump. Note that a plating bump of a nonfluxional material is used as the conductive bump 13. The plating bump is a metal film formed by plating, more specifically a metal film formed by plating, using electroplating or the like, an under metal layer (seed layer) formed on the Au plating film 63 that constitutes the electrode pads 51 and 52. The film thickness of this metal film can be adjusted by changing plating conditions, and it is also possible to form a thick metal film on the under metal layer. The shape of an upper surface of the metal film changes depending on the shape of the under metal layer, and it is therefore possible to form the metal film upper surface into a flat shape or a convex shape by adjusting the shape of the under metal layer as necessary.

Next, the upper surface of the wall portion 44 of the base 4 and the upper surface 733 of the wall portion 73 of the lid 7 are arrange in parallel so that the first area 81 of the base 4 corresponds to the tapered area 91 of the lid 7, and the second area 82 of the base 4 corresponds to the flat area 92 of the lid 7, and the first bonding layer 48 of the base 4 on which crystal resonator plate 2 is mounted and the second bonding layer 75 of the lid 7 are superimposed on each other. Then, heat treatment is performed twice under nitrogen atmosphere. Specifically, heat treatment is performed at a temperature lower than the eutectic temperature of the AuSn alloy under nitrogen atmosphere, and further, heat treatment is performed at a temperature equal to or higher than the eutectic temperature of the AuSn alloy under nitrogen atmosphere. Thus a part (mainly the plating film 482) of the first bonding layer 48 and a part (mainly the Au/Sn plating film 752) of the second bonding layer 75 are heated and melted. The bonding material 12 is formed as a result of heating and melting, the base 4 and the lid 7 are bonded with each other via this bonding material 12 as shown in FIG. 1, and the driving electrodes 31 and 32 of the crystal resonator plate 2 are hermetically sealed (the bonding step in the present invention). As a result, the crystal resonator 1 in which the crystal resonator plate 2 is hermetically sealed is manufactured. Note that in the mode shown in FIGS. 1, 8, and 9, the edge portion to be the border between the upper surface 733 and the inner side surface 732 of the lid 7 is the end portion of the inner space 11 of the package in the width direction. Further, in the manufactured crystal resonator 1, the bonding material 12 does not expand to (reach) the edge portion to be the border between the inner side surface 732 and the upper surface 733, and the bonding material 12 is formed only in the second bonding layer formation area 9 in which the second bonding layer 75 is formed, but is not formed on the edge portion. It is associated with the fact that the bonding material 12 does not go beyond the second bonding layer formation area 9 and expand on the plain surface of the base 4. In practice, in the second bonding layer formation area 9 of the manufactured crystal resonator 1, the Ti film (or a part of the Ti film), which is the sputtered film 751, remains without being taken in by the bonding material 12, and the bonding material 12 is formed on the remaining Ti film (or part of the Ti film). Similarly, in the first bonding layer formation area 8 of the manufactured crystal resonator 1, the Ti film (or a part of the Ti film), which is the sputtered film 481, remains without being taken in by the bonding material 12, and the bonding material 12 is formed on the remaining Ti film (or part of the Ti film).

In such a crystal resonator 1, because the outer circumference portion (the outer side surface 731) of the first main surface 72 of the lid 7 is molded into a tapered shape, the gap formed between the outer circumference portions of the base 4 when the lid 7 is superimposed on the base 4 during the manufacturing process is expanded toward the outward direction D1 of the crystal resonator 1. Therefore, it becomes easy for the gas produced when heat treatment is performed to heat and melt the first bonding layer 48 and the second bonding layer 75 to be emitted in the outward direction D1. Also, the surface area of the meniscus 121 of the bonding material 12 is maintained by molding the outer circumference portion (the outer side surface 731) of the lid 7 to be bonded with the base 4 into a tapered shape, and therefore, it is easy for the gas to be exhausted from the surface of the meniscus 121 to the outside of the crystal resonator 1. Moreover, the width W2 of the second area 82 of the base 4 is set to be 0.66 to 1.2 times the width W4 of the flat area 92 of the lid 7, and therefore, during the formation of the bonding material 12 by heating and melting the first bonding layer 48 and the second bonding layer 75, flow of the molten material of the brazing filler metal toward the inner space 11 side of the package is suppressed when the molten material of the brazing filler metal (AuSn alloy) that constitutes the Au/Sn plating film 752 of the second bonding layer 75 is drawn toward Au that constitutes the plating film 482 of the first bonding layer 48, and entry of the gas produced by heated and melted the brazing filler metal into the inner space 11 of the package is suppressed. Accordingly, the gas amount in the inner space 11 of the package is reduced. Note that in the present embodiment, in the case of the mode shown in FIG. 8, the width W2 of the second area 82 of the base 4 is set to be equal to or smaller than the width W4 of the flat area 92 of the lid 7, and therefore, when the base 4 and the lid 7 are arranged opposite to each other, the end portion 483 of the first bonding layer 48 on the package inner space 11 side does not protrude toward the inner space 11 of the package further than the end portion 754 of the second bonding layer 75 on the package inner space 11 side does.

Particularly, in the case of the mode shown in FIG. 8, the end portion 483 of the first bonding layer 48 on the package inner space 11 side is located further outward (see the direction D1 in FIG. 8) of the package than the end portion 754 of the second bonding layer 75 on the package inner space 11 side, and therefore, the brazing filler metal (the Au/Sn plating film 752) in the end portion 754 of the second bonding layer 75, at the time of heating and melting, is drawn toward the end portion 483 of the first bonding layer 48 on the package inner space 11 side, while flowing in the outward direction D1 (see FIG. 8) of the package. As a result, the gas produced due to the heated and melted brazing filler metal flows together with the brazing filler metal in the outward direction D1 of the package, and is emitted outside the package. Accordingly, the gas amount in the inner space 11 of the package is reduced, and the CI value is suppressed. Also, in the case of the mode shown in FIG. 9, the end portion 754 of the second bonding layer 75 on the package inner space 11 side is located further outward (see the direction D1 in FIG. 9) of the package than the end portion 483 of the first bonding layer 48 on the package inner space 11 side, and therefore, the end portion 483 of the first bonding layer 48 on the package inner space 11 side, at the time of heating and melting, is drawn toward the brazing filler metal (the Au/Sn plating film 752) in the end portion 754 of the second bonding layer 75, while flowing in the outward direction D1 (see FIG. 9) of the package. As a result, the gas produced due to the heated and melted brazing filler metal flows together with the brazing filler metal in the outward direction D1 of the package, and is emitted outside the package. Accordingly, the gas amount in the inner space 11 of the package is reduced, and the CI value is suppressed.

Furthermore, the contact area between the first bonding layer 48 and the second bonding layer 75 is sufficiently maintained as a result of the width W2 of the second area 82 of the base 4 being set to be 0.66 to 1.2 times the width W4 of the flat area 92 of the lid 7, and therefore, position shift hardly occurs when the first bonding layer 48 and the second bonding layer 75 are superimposed on each other and heat treatment is performed. Therefore, the inner space 11 of the package of the crystal resonator 1 can be hermetically sealed reliably, and the yield at the time of manufacturing improves.

Also, the base 4 and the lid 7 are bonded with each other by the bonding material 12, the inner space 11 in which the crystal resonator plate 2 is hermetically sealed is formed, and the flat area 92 and the second area 82 are provided further outward of the package than the inner space 11 (the edge portion to be the border between the upper surface 733 and the inner side surface 732 of the lid 7 that is the end portions of the inner space 11 in the width direction), and therefore, it is possible to reduce the chance of the gas that may be produced at the time when the bonding material 12 is melted for bonding entering the inner space 11. As a result, it is possible to suppress adverse influence on the crystal resonator plate 2 mounted in the inner space 11 inside the package, and improve the reliability of the crystal resonator 1 (the package). For example, if the crystal resonator plate 2, which is a piezoelectric resonator plate, is used as an electronic component element as described in the present embodiment, it is possible to stabilize electrical characteristics such as CI and improve the reliability of the crystal resonator 1 (the package).

Figure 10:
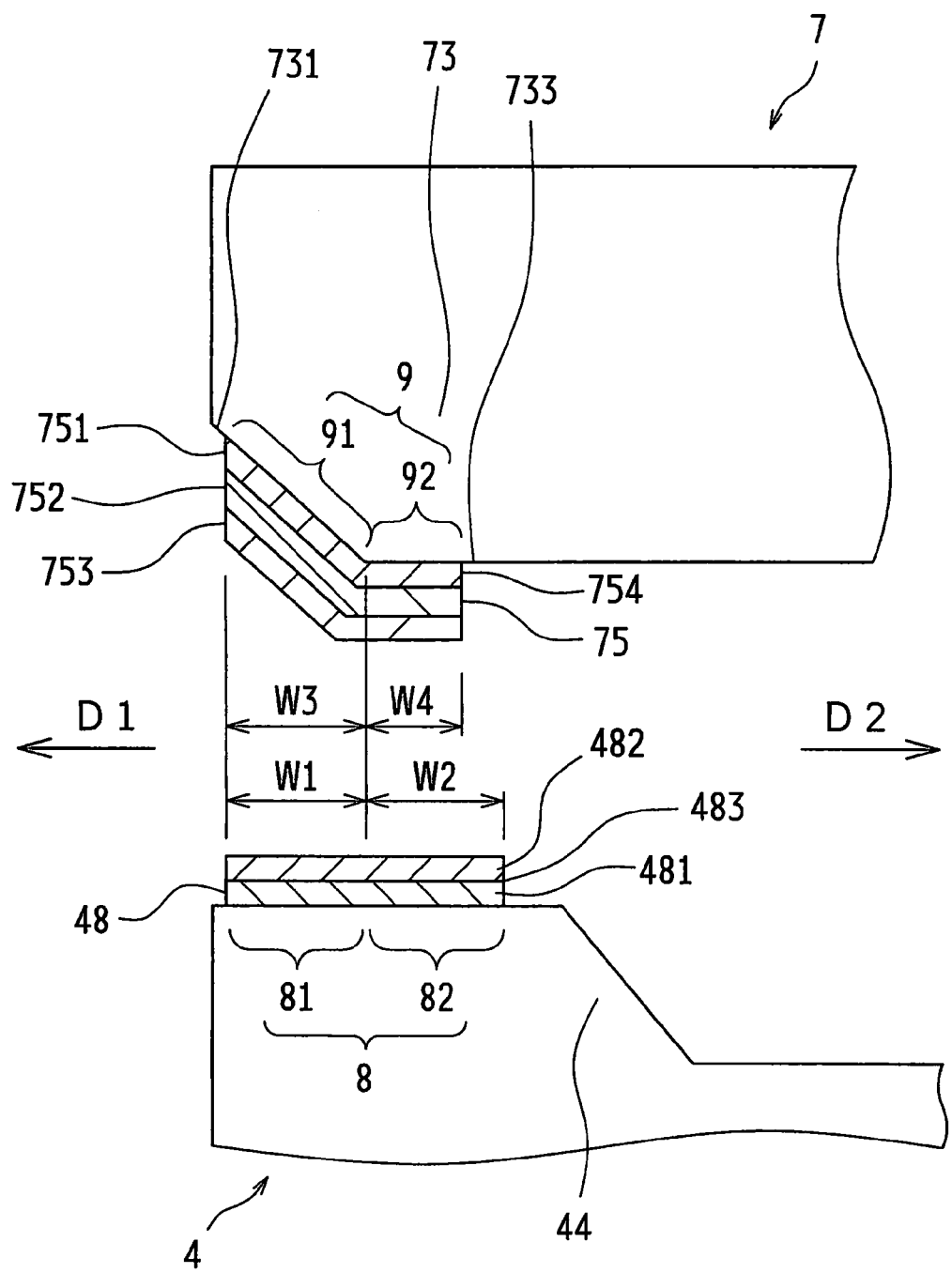
FIG. 10 is an enlarged partial cross-sectional view of a state of the outer circumference portions of the base and the lid according to another embodiment that are arranged opposite to each other.

Note that in the crystal resonator 1 according to the above-described present embodiment, the inner side surface 732 of the lid 7 in the inner space 11 of the package is molded into a tapered shape, but the present invention is not limited thereto, and as shown in FIG. 10, the tapered inner side surface 732 may be removed to form the first main surface 72 of the lid 7 in the inner space 11 of the package as a flat surface. This mode is available to a package in which not the tuning fork-shaped crystal resonator plate but a thin piezoelectric resonator plate such as an AT-cut crystal resonator plate is mounted as the crystal resonator plate 2. In this mode shown in FIG. 10, the edge portion to be the border between the upper surface and the wall surface of the wall portion 44 of the base 4 is the end portion of the inner space 11 of the package in the width direction. The first bonding layer formation area 8 (the first bonding layer 48 formed in the first bonding layer formation area 8) and the second bonding layer formation area 9 (the second bonding layer 75 formed in the second bonding layer formation area 9) are formed further outward (see the outward direction D1 shown in FIG. 10) of the base 4 than the edge portion to be the border between the upper surface and the wall surface of the wall portion 44 of the base 4, and the first bonding layer formation area 8 (the first bonding layer 48 formed in the first bonding layer formation area 8) and the second bonding layer formation area 9 (the second bonding layer 75 formed in the second bonding layer formation area 9) are not formed on the edge portion. With this configuration, the base 4 and the lid 7 are bonded with each other by the bonding material 12 to form the inner space 11 in which the crystal resonator plate 2 is hermetically sealed, and the flat area 92 and the second area 82 are provided further outward of the package than the inner space 11. Also, in the mode shown in FIG. 10, the width W2 of the second area 82 of the base 4 is set to be 0.66 to 1.2 times the width W4 of the flat area 92 of the lid 7.

Figure 11:
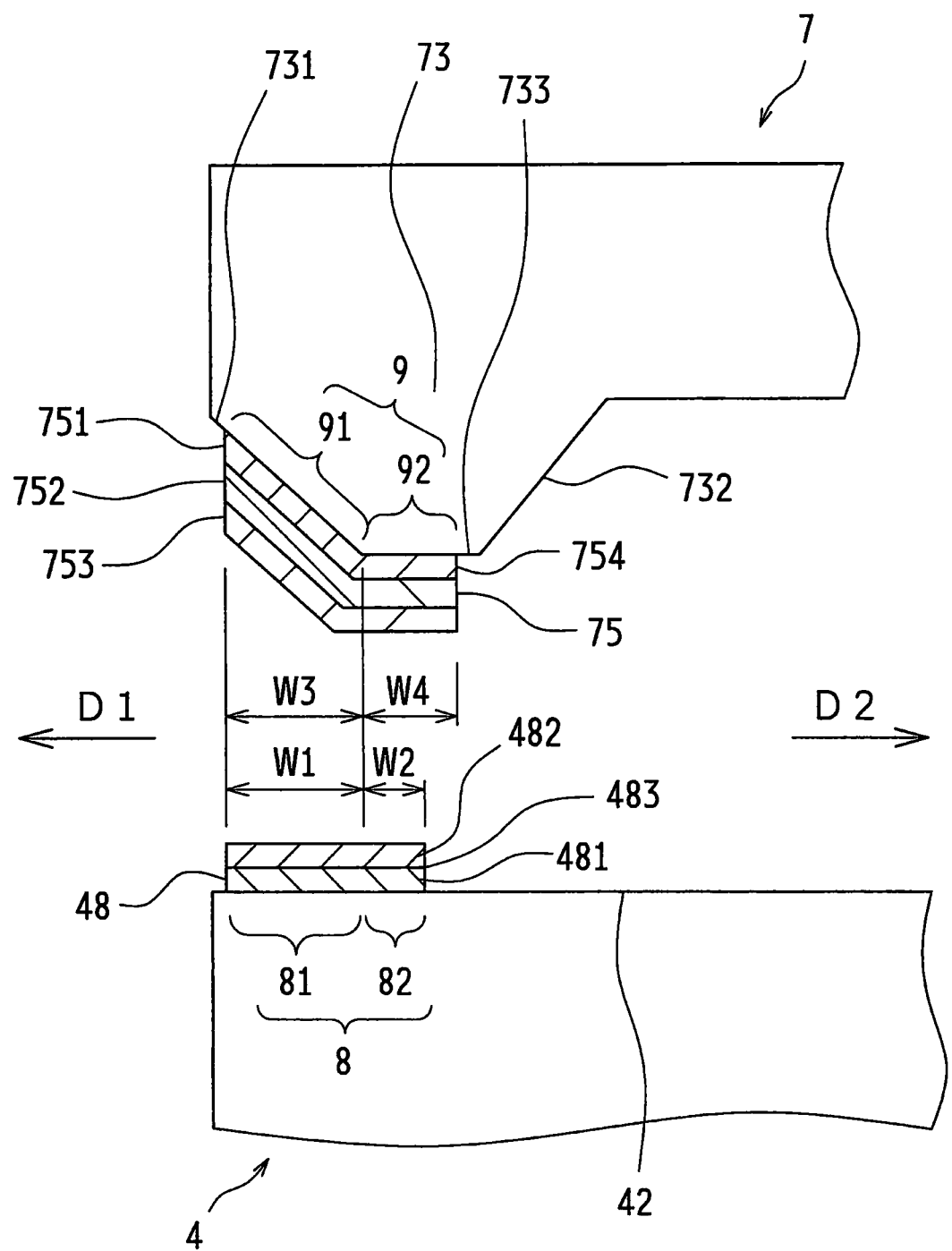
FIG. 11 is an enlarged partial cross-sectional view of a state of the outer circumference portions of the base and the lid according to another embodiment that are arranged opposite to each other.

Meanwhile, although in the crystal resonator 1 according to the above-described present embodiment, the wall portion 44 (the wall surface of the wall portion 44) of the base 4 in the inner space 11 of the package is molded into a tapered shape, the present invention is not limited thereto, and as shown in FIG. 11, the tapered wall surface of the wall portion 44 may be removed to form the first main surface 42 of the base 4 in the inner space 11 of the package as a flat surface. This mode is available to a package in which not the tuning fork-shaped crystal resonator plate but a thin piezoelectric resonator plate such as an AT-cut crystal resonator plate is mounted as the crystal resonator plate 2. In the mode shown in FIG. 11, the edge portion to be the border between the inner side surface 732 and the upper surface 733 of the lid 7 is the end portion of the inner space 11 of the package in the width direction. In other words, the first bonding layer formation area 8 (the first bonding layer 48 formed in the first bonding layer formation area 8) and the second bonding layer formation area 9 (the second bonding layer 75 formed in the second bonding layer formation area 9) are formed further outward (see the direction D1 shown in FIG. 11) of the lid 7 than the edge portion to be the border between the inner side surface 732 and the upper surface 733, and the first bonding layer formation area 8 (the first bonding layer 48 formed in the first bonding layer formation area 8) and the second bonding layer formation area 9 (the second bonding layer 75 formed in the second bonding layer formation area 9) are not formed on the edge portion. With this configuration, the base 4 and the lid 7 are bonded with each other by the bonding material 12 to form the inner space 11 in which the crystal resonator plate 2 is hermetically sealed, and the flat area 92 and the second area 82 are provided further outward of the package than the inner space 11. Also, in the mode shown in FIG. 11, the width W2 of the second area 82 of the base 4 is set to be 0.66 to 1.2 times the width W4 of the flat area 92 of the lid 7.

As described above, as shown in FIGS. 8 to 11, if the lengths of the width W2 of the second area 82 of the base 4 and the width W4 of the flat area 92 of the lid 7 are different (if the width W2 is not the same as the width W4), the area (the second area 82 of the base 4 or the flat area 92 of the lid 7) on which the edge portion to be the end portion of the inner space 11 of the package in the width direction is formed is larger in width, out of the width W2 of the second area 82 of the base 4 and the width W4 of the flat area 92 of the lid 7.

The advantages obtained by the package of the crystal resonator 1 according to the above-described present embodiment will be hereinafter described using examples. Note that in the following description, comparative examples are cited for comparison with the examples.

Example 1

The crystal resonator 1 according to Example 1 uses the package of the crystal resonator 1 according to the mode shown in FIG. 8.

In the base material of the base 4 of the crystal resonator 1 according to Example 1, the width W1 of the first area 81 in the first bonding layer formation area 8 shown in FIG. 8 is 53.0 μm, and the width W2 of the second area 82 is 26.0 μm. As shown in FIG. 8, in the base 4, the first bonding layer 48 is formed in the entire first bonding layer formation area 8. In this first bonding layer 48, the thickness of the Ti film that constitutes the sputtered film 481 is 0.3 μm, the thickness of the Au film that constitutes the sputtered film 481 is 0.06 μm, and the thickness of the Au film that constitutes the plating film 482 is 5.0 μm.

In the base material of the lid 7 of the crystal resonator 1 according to Example 1, the width W3 of the tapered area 91 in the second bonding layer formation area 9 shown in FIG. 8 is 52.0 μm, and the width W4 of the flat area 92 is 27.5 μm. As shown in FIG. 8, in the lid 7, the second bonding layer 75 is formed in the entire second bonding layer formation area 9. In this second bonding layer 75, the thickness of the Ti film that constitutes the sputtered film 751 is 0.3 μm, and the thickness of the Au film that constitutes the sputtered film 751 is 0.06 μm. The thickness of the Au/Sn plating film 752 is 6.5 μm, and the thickness of the Au plating film 753 is 0.6 μm.

Bonding of the base 4 and the lid 7 is implemented by superimposing the first bonding layer 48 of the base 4 and the second bonding layer 75 of the lid 7 on each other, performing heat treatment at a temperature lower than the eutectic temperature of AuSn alloy under nitrogen atmosphere, and after that, further performing heat treatment at a temperature equal to or higher than the eutectic temperature under nitrogen atmosphere.

Example 2

The crystal resonator 1 according to Example 2 uses the package of the crystal resonator 1 according to the mode shown in FIG. 8.

The crystal resonator 1 according to Example 2 is the same as the crystal resonator 1 according to Example 1 except that the width W2 of the second area 82 of the first bonding layer formation area 8 of the base 4 is 18.2 μm, and the base 4 and the lid 7 are bonded with each other by the same method as in Example 1.

Example 3

The crystal resonator 1 according to Example 3 uses the package of the crystal resonator 1 according to the mode shown in FIG. 9.

In the crystal resonator 1 according to Example 3, the width W2 of the second area 82 in the first bonding layer formation area 8 of the base 4 is 24.0 μm, and the width W4 of the flat area 92 in the second bonding layer formation area 9 of the base 4 is 20.0 μm. Note that the base 4 and the lid 7 are bonded with each other by the same method as in Example 1.

Example 4

The crystal resonator 1 according to Example 4 uses the package of the crystal resonator 1 according to the mode shown in FIG. 8.

The crystal resonator 1 according to Example 4 is the same as the crystal resonator 1 according to Example 1 except that the width W2 of the second area 82 in the first bonding layer formation area 8 of the base 4 is 24.0 μm, and the width W4 of the flat area 92 in the second bonding layer formation area 9 of the base 4 is 30.0 μm, and the base 4 and the lid 7 are bonded with each other by the same method as in Example 1.

Comparative Example 1

Figure 12:
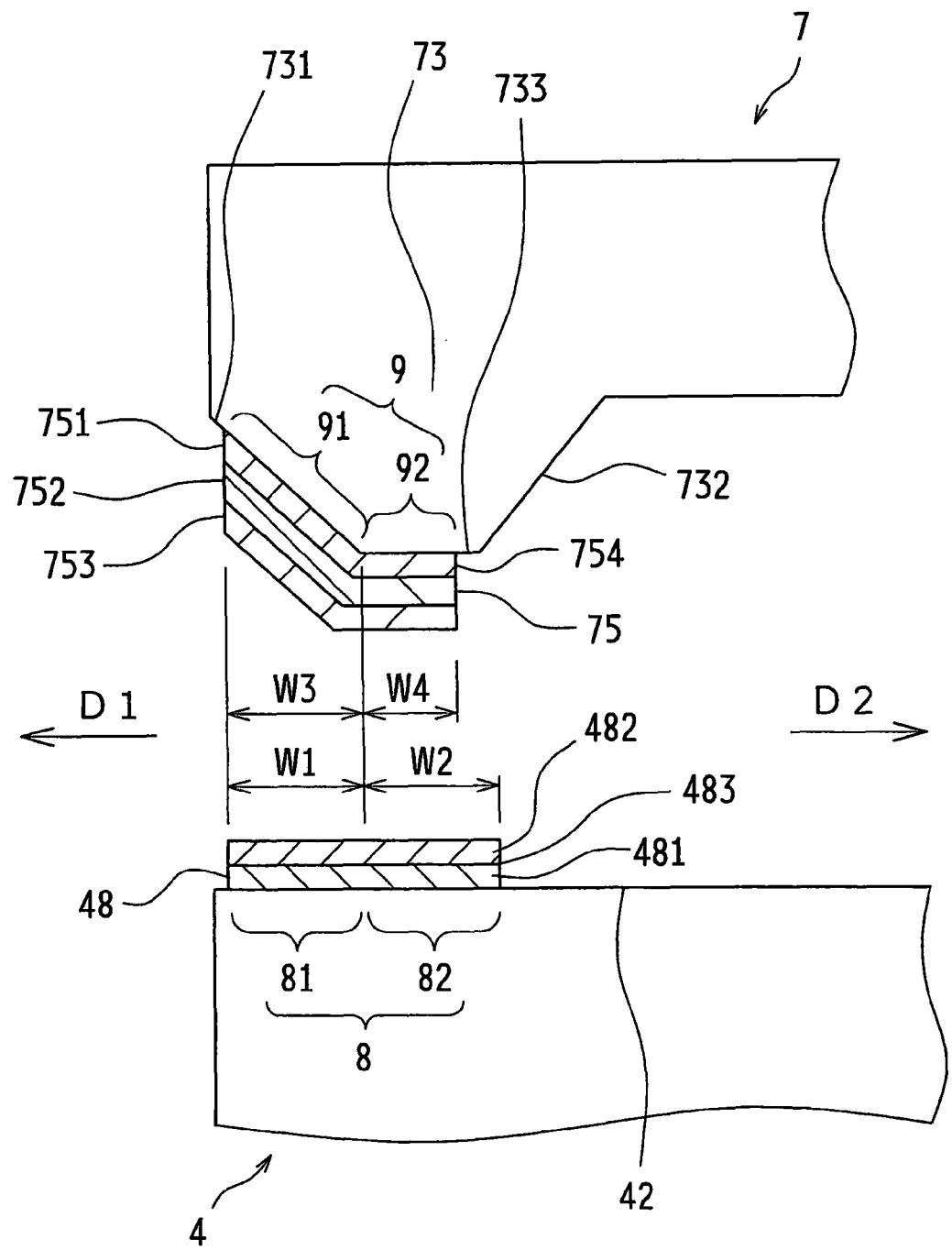
FIG. 12 is an enlarged partial cross-sectional view of a state of the outer circumference portions of the base and the lid according to Comparative example 1 that are arranged opposite to each other.

The crystal resonator 1 according to Comparative example 1 uses the package of the crystal resonator 1 according to the mode shown in FIG. 12.

The crystal resonator 1 according to Comparative example 1 is the same as the crystal resonator 1 according to Example 1 except that the width W2 of the second area 82 in the first bonding layer formation area 8 of the base 4 is 36.3 μm.

Comparative Example 2

The crystal resonator 1 according to Comparative example 2 uses the package of the crystal resonator 1 according to the mode shown in FIG. 8.

The crystal resonator 1 according to Comparative example 2 is the same as the crystal resonator 1 according to Example 1 except that the width W2 of the second area 82 in the first bonding layer formation area 8 of the base 4 shown in FIG. 8 is 5.4 μm, and the base 4 and the lid 7 are bonded with each other by the same method as in Example 1.

Comparative Experiment on ΔCI Value and Yield

Nine crystal resonators 1 were manufactured for each of the abovementioned Examples 1, 2, 3, and 4 and Comparative examples 1 and 2. Also, it was checked, with respect to each manufactured crystal resonator 1, whether or not the piezoelectric resonator plate 2 has vibration characteristics. Then, with respect to the crystal resonators 1 of Examples 1, 2, 3, and 4 and Comparative examples 1 and 2, respectively, the number of the crystal resonators 1 that were found to have vibration characteristics was divided by 9, namely the number of the manufactured crystal resonators 1, and the result was translated into percentage to obtain the yield (%).

Also, with respect to each crystal resonator 1 that was found to have vibration characteristics, a CI value of the crystal resonator plate before the bonding of the base 4 and the lid 7 (hereinafter referred to as pre-sealing CI value) and a CI value after the base 4 and the lid 7 were bonded with each other and the crystal resonator plate 2 is hermetically sealed (hereinafter referred to as post-sealing CI value) were measured, and a variation of the post-sealing CI value relative to the pre-sealing CI value (hereinafter referred to as ΔCI value) was obtained. Then, for the crystal resonators 1 of the Examples 1, 2, 3, and 4 and Comparative examples 1 and 2, respectively, an average value of the ΔCI values of the crystal resonators 1 that were found to have vibration characteristics (hereinafter referred to as an average ΔCI value) was calculated.

Table 1 shows the average ΔCI values (kΩ) and the yields (%) for the respective crystal resonators 1 of Examples 1, 2, 3, and 4 and Comparative examples 1 and 2.

TABLE 1

|  | Comparative Example 1 | Example 1 | Example 2 | Example 3 | Example 4 | Comparative Example 2 |
|---|---|---|---|---|---|---|
| W2(μm) | 36.3 | 26.0 | 18.2 | 24.0 | 24.0 | 5.4 |
| W4(μm) | 27.5 | 27.5 | 27.5 | 20.0 | 30.0 | 27.5 |
| W2/W4 | 1.32 | 0.95 | 0.66 | 1.20 | 0.80 | 0.20 |
| AverageΔCI (kΩ) | 5.45 | 3.65 | 3.70 | 3.82 | 3.70 | 6.76 |
| Yield (%) | 100 | 100 | 88 | 100 | 98 | 44 |

As shown in Table 1, it was found that the crystal resonators 1 of the Examples 1, 2, 3, and 4 in which the width W2 of the second area 82 is in the range of 0.66 to 1.2 times the width W4 of the flat area 92 have smaller average ΔCI values compared with those in Comparative examples 1 and 2 in which the width W2 of the second area 82 is out of the range of 0.66 to 1.2 times the width W4 of the flat area 92. It was also found that the crystal resonators 1 of the Examples 1, 2, 3, and 4 have smaller average ΔCI values and better yields compared with the crystal resonators 1 in Comparative example 2. Such difference in the average ΔCI values and the yields based on the width W2 of the second area 82 arises for the following reason.

In Comparative example 1 in which, in the package shown in FIG. 12, the width W2 of the second area 82 in the base 4 is set to be longer than the width W4 of the flat area 92 of the lid 7, when the base 4 and the lid 7 are arranged opposite to each other, the end portion 483 of the first bonding layer 48 on the package inner space 11 side is located further inward of the package inner space 11 side than the end portion 754 of the second bonding layer 75 on the package inner space 11 side, as shown in FIG. 12. Therefore, when the first bonding layer 48 and the second bonding layer 75 are superimposed on each other and heat treatment is performed, the molten material of AuSn alloy (the brazing filler metal) that constitutes the Au/Sn plating film 752 in the second bonding layer 75 is drawn toward Au that constitutes the plating film 482 in the first bonding layer 48 and flows in the inward direction D2 of the package. Simultaneously, the gas produced due to the heated and melted brazing filler metal also flows in the inward direction D2 of the package accompanying flow of the brazing filler metal, and the gas enters the inner space 11 of the package.

Meanwhile, in Examples 1, 2, 3, and 4 in which the first bonding layer formation area 8 (the first bonding layer 48 formed in the first bonding layer formation area 8) and the second bonding layer formation area 9 (the second bonding layer 75 formed in the second bonding layer formation area 9) are formed further outward (see the direction D1 shown in FIGS. 8 to 11) of the package than the edge portion to be the end portion of the inner space of the package in the width direction, when the base 4 and the lid 7 are arranged opposite to each other, the end portion 483 of the first bonding layer 48 on the package inner space 11 side is located further outward (outside) of the package than the end portion 754 of the second bonding layer 75 on the package inner space 11 side, as shown in FIGS. 8 to 11. Therefore, when the first bonding layer 48 and the second bonding layer 75 are superimposed on each other and heat treatment is performed, the molten material of the brazing filler metal (AuSn alloy) that constitutes the Au/Sn plating film 752 in the second bonding layer 75 is drawn toward Au that constitutes the plating film 482 in the first bonding layer 48, and flows in the outward direction D1 of the package. Simultaneously, the gas produced due to the heated and melted brazing filler metal also flows in the outward direction D1 of the package accompanying flow of the brazing filler metal. Therefore, entry of the gas into the inner space 11 of the package is suppressed. As a result, the crystal resonators 1 of Examples 1, 2, 3, and 4 have smaller average ΔCI values compared with those in Comparative example 1.

Further, if the width W2 of the second area 82 in the base 4 is too shorter than the width W4 of the flat area 92 of the lid 7, specifically if, as in Comparative example 2, the width W2 of the second area 82 is smaller than 0.66 times the width W4 of the flat area 92, the amount of Au that constitutes the plating film 482 in the first bonding layer 48 is too small, and therefore, the molten material of the brazing filler metal (AuSn alloy) that constitutes the Au/Sn plating film 752 in the second bonding layer 75 is not drawn toward Au that constitutes the plating film 482 in the first bonding layer 48 and the brazing filler metal stays in the flat area 92. As a result, formation of the meniscus 121 by the bonding material 12 is insufficient, and moreover, the gas produced due to the melted brazing filler metal remains in the inner space 11 of the package. Therefore, the average ΔCI value becomes large. Furthermore, because the contact area between the first bonding layer 48 and the second bonding layer 75 is so small that position shift easily occurs, the inner space 11 of the package cannot be hermetically sealed reliably, and the yield at the time of manufacturing deteriorates.

Meanwhile, in Examples 1, 2, 3, and 4 in which the width W2 of the second area 82 is 0.66 to 1.2 times the width W4 of the flat area 92, the amount of Au that constitutes the plating film 482 in the first bonding layer 48 is sufficiently maintained, and therefore, the molten material of the AuSn alloy (the brazing filler metal) that constitutes the Au/Sn plating film 752 in the second bonding layer 75 is drawn towards Au that constitutes the plating film 482 in the first bonding layer 48 and reliably flows outward (see the direction D1, which is the outward direction, shown in FIGS. 8 to 11) of the package, and the gas amount in the inner space 11 of the package is suppressed. Furthermore, because the contact area between the first bonding layer 48 and the second bonding layer 75 is sufficiently maintained, position shift of the second bonding layer 75 relative to the first bonding layer 48 is suppressed. As a result, the inner space 11 of the package of the crystal resonator 1 can be hermetically sealed reliably, and the yield at the time of manufacturing improves.

As described above, the crystal resonators 1 in Examples 1, 2, 3, and 4 have the smaller gas amount in the inner space 11 compared with the crystal resonators 1 in Comparative examples 1 and 2. Therefore, it can be found that the crystal resonators 1 in Examples 1, 2, 3, and 4 have the smaller average ΔCI values compared with the crystal resonators 1 in Comparative examples 1 and 2. Furthermore, in the crystal resonators 1 of Examples 1, 2, 3, and 4, the contact area between the first bonding layer 48 and the second bonding layer 75 is sufficiently maintained, and position shift of the second bonding layer 75 relative to the first bonding layer 48 is unlikely to occur. Therefore, it can be found that the crystal resonators 1 of Examples 1, 2, 3, and 4 have the better yield at the time of manufacturing compared with the crystal resonator 1 of Comparative example 2 in which the width W2 of the second area 82 of the base 4 is smaller than 0.66 times the width W4 of the flat area 92 of the lid 7 (i.e., the contact area between the first bonding layer 48 and the second bonding layer 75 is not sufficiently maintained).

Note that in the lid 7 of the crystal resonator 1 according to the present embodiment (see FIGS. 5, 6, and 8 to 11), the tapered area 91 is provided on a part of the outer side surface 731 molded into a tapered shape, but a configuration in which the entire outer side surface 731 is formed as the tapered area 91 has the same advantage as that of the present embodiment.

Further, in the lid 7 of the crystal resonator 1 according to the present embodiment (see FIGS. 5, 6, 8, 9, and 11), the flat area 92 is provided on a part of the upper surface 733 of the wall portion 73, but a configuration in which, as shown in FIG. 10, the entire upper surface 733 is formed as the flat area 92 has the same advantage as that of the present embodiment.

Further, the base 4 of the crystal resonator 1 according to the present embodiment (see FIGS. 2 to 4 and 8 to 10) is constituted of the bottom portion 41 and the wall portion 44, but a configuration in which, as shown in FIG. 11, the wall portion 44 is removed and only the bottom portion 41 is provided has the same advantage as that of the present embodiment.

Further, the lid 7 of the crystal resonator 1 according to the present embodiment is constituted of the top portion 71 and the wall portion 73 that protrudes downwards from the top portion 71 along the outer circumference of the first main surface 72 of the lid 7, and the outer side surface 731 and the inner side surface 732 of the wall portion 73 are molded into a tapered surface. However, a configuration in which only the outer circumference portion of the rectangular parallelepiped single plate is molded into a tapered shape has the same advantage as that of the present embodiment.

Further, in the base 4 of the crystal resonator 1 according to the present embodiment (see FIGS. 2 to 4), the first bonding layer 48 is constituted of the sputtered film 481 configured from the Ti film and the Au film formed by sputtering on the base material of the base 4, and the plating film 482 configured from the Au film formed by plating on this sputtered film 481, but the configuration of the base 4 is not limited thereto. For example, the first bonding layer 48 may be constituted of the sputtered film configured from the Ti film and the Au film formed by sputtering on the base material of the base 4, an Ni plating film formed by plating on the sputtered film, and the Au plating film formed by plating on the Ni plating film. By placing the Ni plating film between the sputtered film and the Au plating film, erosion of the sputtered film (the Au film) cause by the brazing filler metal (AuSn alloy) contained in the second bonding layer 75 can be prevented, and it is possible to improve the bonding strength between the base 4 and the lid 7.

Further, in the lid 7 of the crystal resonator 1 according to the present embodiment (see FIGS. 5 and 6), the AuSn alloy is used as the brazing filler metal contained in the second bonding layer 75. However, the second bonding layer 75 is not particularly limited as long as it contains brazing filler metal capable of forming a bonding material for bonding the base 4 and the lid 7 with each other, and for example, the second bonding layer 75 may be contain the Sn alloy brazing filler metal such as CuSn.

In the crystal resonator 1 according to the above-described present embodiment, the electrode pads 51 and 52 and the wiring pattern 55 on the first main surface 42 side of the base 4 are constituted of the first sputtered film 61 configured from the Ti film and the Cu film formed on the base plate of the base 4, the second sputtered film 62 configured from the Ti film and the Au film formed on the first sputtered film 61, and the Au plating film 63 configured from the Au film formed by plating on the second sputtered film 62. However, the electrode structure of the electrode pads 51 and 52 and the wiring pattern 55 is not limited thereto, and the sputtered film configured from the Ti film and the Au film may be formed directly on the base plate of the base 4 without having the sputtered film configured from the Ti film and the Cu film therebetween, and the Au film may be formed by plating on that sputtered film. In other words, the sputtered film of the wiring pattern 55 on the inner surface 491 of each through hole 49 may be constituted of the Ti film and the Au film. Thus, in the case of forming the sputtered film on the inner surface 491 of each through hole 49 using the Ti film and the Au film, the bonding strength between the sputtered film of the wiring pattern 55 on the inner surface 491 and the filling layer 66 can be improved by using an AuSn plating film as the filling layer 66 formed by plating on the sputtered film of the wiring pattern 55 on the inner surface 491 of the through hole 49.

Further, in the base 4 of the crystal resonator 1 according to the present embodiment, as described above, the external terminal electrodes 53 and 54 are constituted of the first sputtered film 61 configured from the Ti film and the Cu film, the second sputtered film 62 configured from the Ti film and the Au film formed on the first sputtered film 61, the Ni plating film 64 made of Ni formed by plating on the second sputtered film 62, and the Au plating film 65 made of Au formed by plating on the Ni plating film 64. However, the configuration of the external terminal electrodes 53 and 54 is not limited thereto, and for example, the Au plating film made of Au may be formed directly on the second sputtered film 62 (without placing the Ni plating film 64 made of Ni therebetween). Alternatively, instead of the Ni plating film 64, an Au/Cu alloy plating film or a Pd plating film may be formed by plating on the second sputtered film 62, and an Au plating film may be formed on the Au/Cu alloy plating film or the Pd plating film.

Further, in the crystal resonator 1 according to the present embodiment, the resin pattern 67 is formed on the entire area of the second main surface 43 of the base 4 excluding the formation area of the external terminal electrodes 53 and 54, but the configuration is not limited thereto, and the resin pattern 67 may be formed only at an end portion of the through hole 49 on the second main surface 43 side and the surrounding area thereof. Alternatively, the resin pattern 67 does not have to be formed.

Further, in the crystal resonator 1 according to the present embodiment, the tapered surface is formed on the second main surface 43 of the base 4 along the entire outer circumference 47, but the present invention is not limited to such a configuration. For example, on the second main surface 43 of the base 4, the tapered surface may be formed only in an area of the outer circumference 47 facing the external terminal electrodes 53 and 54. Alternatively, the entire second main surface 43 of the base 4 may be a flat surface.

Further, in the present embodiment, glass is used as the material of the base 4 and the lid 7, but both the base 4 and the lid 7 are not limited to those made of glass, and for example, the base 4 and the lid 7 may be made of crystal.

Further, in the present embodiment, the Ti film are used in the sputtered film 751 and the sputtered film 481, but the material is not limited to Ti, and Mo, W, Cr, or the like may be added to Ti, or Mo, W, Cr, or the like may be used instead of Ti.

Further, in the crystal resonator 1 according to the present embodiment, the tuning folk-shaped crystal resonator plate shown in FIG. 7 is used as the crystal resonator plate 2, but an At-cut crystal resonator plate may alternatively be used. In the crystal resonator 1 using the AT-cut crystal resonator plate, electrodes are formed on the base 4 so as to be suited for the AT-cut crystal resonator plate, but the configuration according to the present invention is the same as that in the present embodiment, and has the same advantage as that of the present embodiment.

Further, an IC chip as well as the crystal resonator plate 2 may be mounted to the base 4 according to the present embodiment to form an oscillator. In the case of mounting the IC chip on the base 4, the electrodes suited for the electrode structure of the IC chip are formed on the base 4.

The embodiment of the electronic component package according to the present invention in the case of being applied to the package of the crystal resonator 1 has been described above, but it is a preferable embodiment, and the electronic component package according to the present invention may be of any kinds as long as electrodes of an electronic component element are sealed by the first sealing member and the second sealing member. Accordingly, the electronic component package according to the present invention may be a package of a piezoelectric resonator device for hermetically sealing, using the first sealing member and the second sealing member, driving electrodes of a piezoelectric resonator plate constituted of a piezoelectric material other than crystal, such as lithium tantalite or lithium niobate.

Note that the present invention can be implemented in various other modes without departing from its spirit or main characteristics. Therefore, the above-described embodiment is a mere example, and should not be interpreted in a restricting manner. The scope of the present invention is indicated by the scope of claims, and is not limited to the specification in any way. Furthermore, all variations and modifications equivalent to the scope of claims are within the scope of the present invention.

Furthermore, the present invention claims priority based on Japanese Patent Application No. 2011-061329 filed in Japan on Mar. 18, 2011. The entire contents thereof are herein incorporated by reference.

INDUSTRIAL APPLICABILITY

The present invention is particularly preferable for an electronic component and an electronic component package used for a piezoelectric resonator device serving as the electronic component.

DESCRIPTION OF REFERENCE NUMERALS

1 Crystal resonator (electronic component)
11 Inner space
12 Bonding material
13 Conductive bump
2 Crystal resonator plate (electronic component element)
20 Piezoelectric resonator blank
21, 22 Leg portion
211, 221 Tip portion
23 Base portion
231 First end surface
232 Second end surface
233 Side surface
24 Bonded portion
241 Short side portion
242 Long side portion
243 Tip portion
25 Groove portion
26 Through hole
27 Bonded point
31, 32 Driving electrode
33, 34 Extracting electrode
4 Base (first sealing member)
41 Bottom portion
42 First main surface
43 Second main surface
44 Wall portion
45 Cavity
451 Bottom surface
452 End portion
46 Mount portion
47 Outer circumference
471 Tapered surface
48 First bonding layer
481 Sputtered film
482 Plating film
483 End portion
49 Through hole
491 Inner surface
51, 52 Electrode pad
53, 54 External terminal electrode
55 Wiring pattern
56, 57 Electrode formation portion
61 First sputtered film
62 Second sputtered film
63 Au plating film
64 Ni plating film
65 Au plating film
66 Filling layer
67 Resin pattern
7 Lid (second sealing member)
71 Top portion
72 First main surface
721 Outer circumference
73 Wall portion
731 Outer side surface (outer circumference portion)
732 Inner side surface
733 Upper surface
74 Second main surface
75 Second bonding layer
751 Sputtered film
752 Au/Sn plating film
753 Au plating film
754 End portion
8 First bonding layer formation area
81 First area
82 Second area
9 Second bonding layer formation area
91 Tapered area
92 Flat area W1 Width of first area
W2 Width of second area
W3 Width of tapered area
W4 Width of flat area

The invention claimed is:

1. An electronic component package for hermetically sealing an electrode of an electronic component element comprising a first sealing member having a first main surface on which the electronic component element is mounted, and a second sealing member,
   wherein a first main surface of the second sealing member is bonded with the first main surface of the first sealing member through a bonding material,
   an outer circumference portion of the first main surface of the second sealing member is molded into a tapered shape that tilts toward a second main surface of the second sealing member,
   a tapered area is provided in at least a part of the outer circumference portion molded into a tapered shape,
   a flat portion is provided inward of the outer circumference portion of the first main surface of the second sealing member,
   a flat area adjacent to the tapered area is provided in at least a part of the flat portion,
   a first area corresponding to the tapered area and a second area corresponding to the flat area are provided so as to be adjacent to each other on the first main surface of the first sealing member,
   a surface of the second area is parallel to a surface of the flat area,
   a width of the second area is 0.66 to 1.2 times a width of the flat area,
   the bonding material includes a first bonding layer formed in an entire first bonding layer formation area including the first area and the second area and a second bonding layer containing a brazing filler metal formed in an entire second bonding layer formation area including the tapered area and the flat area,
   an area width of the first bonding layer formation area differs from an area width of the second bonding layer formation area as much as the width of the second area differs from the width of the flat area.

2. The electronic component package according to claim 1, wherein an inner space in which the electronic component is hermetically sealed is formed as a result of the first sealing member and the second sealing member being bonded with each other by the bonding material, and
   the flat area and the second area are provided further outward of the electronic component package than the inner space.

3. The electronic component package according to claim 1, wherein a surface of the first bonding layer is made of Au plating, and
   the brazing filler metal is made of AuSn alloy.

4. An electronic component wherein an electrode of an electronic component element is hermetically sealed by the electronic component package according to claim 1.

5. A method for manufacturing an electronic component package for hermetically sealing an electrode of an electronic component element, comprising:

a first molding step of molding a first sealing member having a first main surface on which the electronic component element is mounted;
   a second molding step of molding a second sealing member;
   a first bonding layer forming step of forming a first bonding layer on the first main surface of the first sealing member;
   a second bonding layer forming step of forming a second bonding layer containing a brazing filler metal on a first main surface of the second sealing member; and
   a bonding step of heating and melting the first bonding layer and the second bonding layer in a state where the first bonding layer and the second bonding layer are superimposed on each other, forming a bonding material, and bonding the first main surface of the second sealing member with the first main surface of the first sealing member,
   wherein in the second molding step,
   an outer circumference portion of the first main surface of the second sealing member is molded into a tapered shape that tilts toward a side of a second main surface of the second sealing member, and a flat portion is provided inward of the outer circumference portion of the first main surface of the second sealing member,
   in the second bonding layer forming step,
   a tapered area is provided in at least a part of the outer circumference portion of the second sealing member molded into a tapered shape,
   a flat area adjacent to the tapered area is provided in at least a part of the flat portion provided inward of the outer circumference portion of the first main surface of the second sealing member, and
   the second bonding layer is formed in an entire second bonding layer formation area including the tapered area and the flat area,
   in the first bonding layer forming step,
   a first area corresponding to the tapered area and a second area corresponding to the flat area are provided so as to be adjacent to each other on the first main surface of the first sealing member,
   a width of the second area is 0.66 to 1.2 times a width of the flat area, and
   the first bonding layer is formed in an entire first bonding layer formation area including the first area and the second area,
   in the bonding step,
   a surface of the second area is arranged parallel to a surface of the flat area,
   the first bonding layer and the second bonding layer are superimposed on each other in a state where an area width of the first layer differs from an area width of the second bonding layer as much as the width of the second area differs from the width of the flat area,
   and the first bonding layer and the second bonding layer are heated and melted.

* * * * *